United States Patent
Heo

(10) Patent No.: US 12,374,267 B2
(45) Date of Patent: Jul. 29, 2025

(54) MURA COMPENSATION DATA GENERATE DEVICE AND OPERATION METHOD THEREOF, AND DISPLAY DRIVING CIRCUIT COMPENSATING MURA OF DISPLAY PANEL

(71) Applicant: SAMSUNG ELECTRONICS CO., LTD., Suwon-si (KR)

(72) Inventor: Pil-Seung Heo, Suwon-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 74 days.

(21) Appl. No.: 18/533,993

(22) Filed: Dec. 8, 2023

(65) Prior Publication Data
US 2025/0014499 A1    Jan. 9, 2025

(30) Foreign Application Priority Data
Jul. 4, 2023    (KR) .................. 10-2023-0086430

(51) Int. Cl.
G09G 3/20    (2006.01)
H03M 7/30    (2006.01)

(52) U.S. Cl.
CPC ............ *G09G 3/2096* (2013.01); *H03M 7/60* (2013.01); *G09G 2320/0233* (2013.01); *G09G 2360/147* (2013.01)

(58) Field of Classification Search
None
See application file for complete search history.

(56) References Cited

U.S. PATENT DOCUMENTS

| | | | |
|---|---|---|---|
| 7,545,393 B2 | 6/2009 | Kanai | |
| 9,495,894 B2 | 11/2016 | Yamanaka et al. | |
| 9,818,373 B2 | 11/2017 | Ohta et al. | |
| 9,898,998 B2 | 2/2018 | Lee et al. | |
| 10,283,071 B2 | 5/2019 | Liu et al. | |
| 10,410,569 B2 | 9/2019 | Drzaic et al. | |
| 10,553,144 B2 | 2/2020 | Tsuchida | |
| 11,551,614 B2* | 1/2023 | Berget | G09G 5/395 |
| 2005/0012821 A1 | 1/2005 | Kana | |
| 2015/0145841 A1 | 5/2015 | Lee et al. | |
| 2015/0279324 A1 | 10/2015 | Ohta et al. | |
| 2015/0356899 A1 | 12/2015 | Yamanaka et al. | |
| 2016/0351094 A1* | 12/2016 | Chaji | G09G 5/026 |

(Continued)

*Primary Examiner* — Christopher J Kohlman
(74) *Attorney, Agent, or Firm* — Sughrue Mion, PLLC

(57) ABSTRACT

A method performed by a mura compensation data generation device, the method includes: generating optical information for a plurality of pixels of a display panel operating based on test data; generating, based on the optical information, raw mura compensation data to compensate input video data provided to the display panel; extracting a high spatial frequency component and a low spatial frequency component from the raw mura compensation data; generating a compressed high spatial frequency component, by compressing, based on a first compression algorithm, the high spatial frequency component; generating a compressed low spatial frequency component, by compressing, based on a second compression algorithm, the low spatial frequency component; and storing the compressed high spatial frequency component and the compressed low spatial frequency component in an external storage circuit.

20 Claims, 26 Drawing Sheets

(56) References Cited

U.S. PATENT DOCUMENTS

| | | |
|---|---|---|
| 2018/0047326 A1 | 2/2018 | Tsuchida |
| 2018/0166030 A1 | 6/2018 | Liu et al. |
| 2018/0350290 A1 | 12/2018 | Drzaic et al. |
| 2021/0264833 A1* | 8/2021 | Heo ................... G09G 3/006 |
| 2024/0404479 A1* | 12/2024 | Shehata ............ G09G 3/3291 |

* cited by examiner

FIG. 6

MCD raw

ROW1

CV11 CV12 CV13 CV14 CV15 ...
CV21 CV22 CV23 CV24
CV31 CV32 CV33
CV41 CV42
CV51 ...

FIG. 12
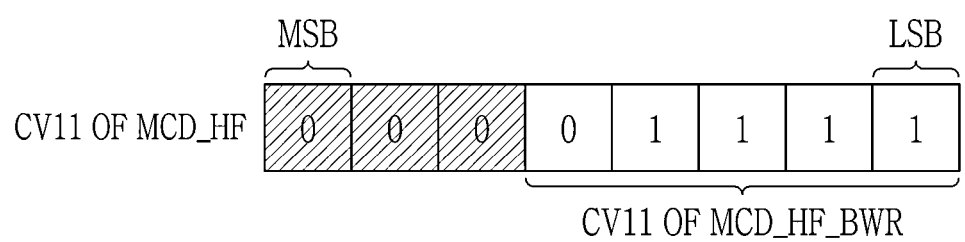
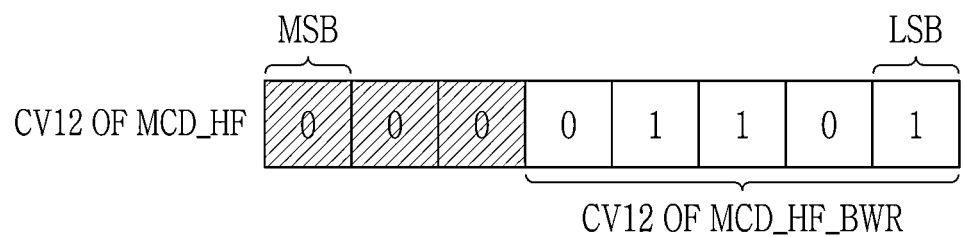
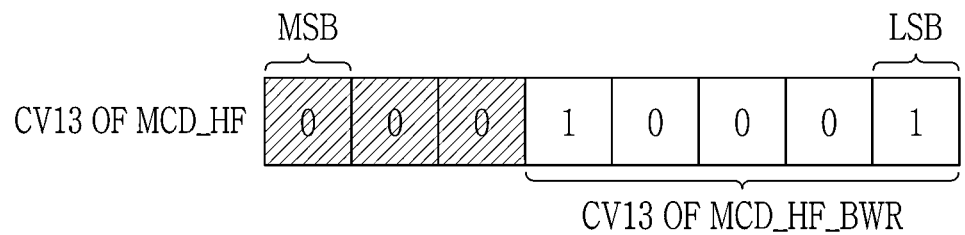

FIG. 13

|  | MCD_raw | MCD_HF | MCD_LF |
|---|---|---|---|
| COMPRESSION SCHEME | MLC | Bit-width reduction MLC | PCA |
| COMPRESSION RATIO. | 1/3 | 5/8 × 1/3 | 1/68 |

MURA COMPENSATION DATA GENERATE DEVICE AND OPERATION METHOD THEREOF, AND DISPLAY DRIVING CIRCUIT COMPENSATING MURA OF DISPLAY PANEL

CROSS-REFERENCE TO RELATED APPLICATION

This application is based on and claims priority under 35 U.S.C. § 119 to Korean Patent Application No. 10-2023-0086430, filed on Jul. 4, 2023, in the Korean Intellectual Property Office, the disclosure of which is incorporated by reference herein in its entirety.

BACKGROUND

1. Field

The disclosure relates to a display device. In particular, the disclosure related to a mura compensation data generation device configured to generate a mura compensation data for compensating mura of a display panel, and a display driving circuit configured to compensate mura of a display panel, based on the mura compensation data.

2. Description of the Related Art

A display panel includes a plurality of pixels that operate based on electrical signals. Each of the plurality of pixels is configured to represent the same luminance in response to the same electrical signal.

However, due to process deviations in the display panel, noises in the electrical signal, and the like, the luminance represented by each of the plurality of pixels may be different even though the display driving circuit controls each of the plurality of pixels with the same electrical signal. The luminance non-uniformity, so-called "MURA (むら)" (hereinafter, "mura"), which looks like a stain, may appear in the display panel.

The display driving circuit may adjust the electrical signals for providing to the plurality of pixels to compensate the mura of the display panel. However, as display panels and display driving circuits become more integrated, the data size for compensating mura increases. Thus, there is a need to reduce the data size for compensating mura.

SUMMARY

The disclosure is aimed at solving the technical objects described above. In particular, provided are a mura compensation data generation device for minimizing the amount of information used to compensate mura of a display panel, and a display driving circuit for compensating for mura of the display panel, based on mura compensation data.

According to an aspect of the disclosure, a method performed by a mura compensation data generation device, the method includes: generating optical information for a plurality of pixels of a display panel operating based on test data; generating, based on the optical information, raw mura compensation data to compensate input video data provided to the display panel; extracting a high spatial frequency component and a low spatial frequency component from the raw mura compensation data; generating a compressed high spatial frequency component, by compressing, based on a first compression algorithm, the high spatial frequency component; generating a compressed low spatial frequency component, by compressing, based on a second compression algorithm, the low spatial frequency component; and storing the compressed high spatial frequency component and the compressed low spatial frequency component in an external storage circuit.

According to an aspect of the disclosure, a display driving circuit for controlling a display panel, includes: a first decompression circuit configured to generate first mura compensation data by decompressing first compressed mura compensation data; a second decompression circuit configured to generate second mura compensation data by decompressing second compressed mura compensation data; a mura compensation data merge circuit configured to generate third mura compensation data by merging the first mura compensation data and the second mura compensation data; and a mura compensation circuit configured to generate output video data corresponding to input video data provided from an external device, based on the third mura compensation data, wherein a spatial frequency of the first mura compensation data is higher than a spatial frequency of the second mura compensation data.

According to an aspect of the disclosure, a mura compensation data generation device includes: an optical measuring circuit configured to generate optical information including a plurality of luminance values for a plurality of pixels on a display panel operating based on test data; a spatial frequency component extract circuit configured to extract a high spatial frequency component of the optical information and a low spatial frequency component of the optical information from the optical information, based on the plurality of luminance values; a first compensation data generation circuit configured to generate a first mura compensation data corresponding to the plurality of pixels, based on the high spatial frequency component of the optical information; a second compensation data generation circuit configured to generate a second mura compensation data corresponding to the plurality of pixels, based on the low spatial frequency component of the optical information; a first compression circuit configured to compress, based on a first compression algorithm, the first mura compensation data and to provide the compressed first mura compensation data to an external device; and a second compression circuit configured to compress, based on a second compression algorithm, the second mura compensation data and to provide the compressed second mura compensation data to the external device.

BRIEF DESCRIPTION OF DRAWINGS

The above and other aspects, features, and advantages of certain embodiments of the disclosure will be more apparent from the following description taken in conjunction with the accompanying drawings, in which:

FIG. 6 illustrates a raw mura compensation data of FIG. 4;

FIG. 12 illustrates an operation of a bit-width reduction module of FIG. 11;

FIG. 13 is a table showing compression ratios for mura compensation data according to an embodiment of the disclosure;

DETAILED DESCRIPTION

Figure 1:
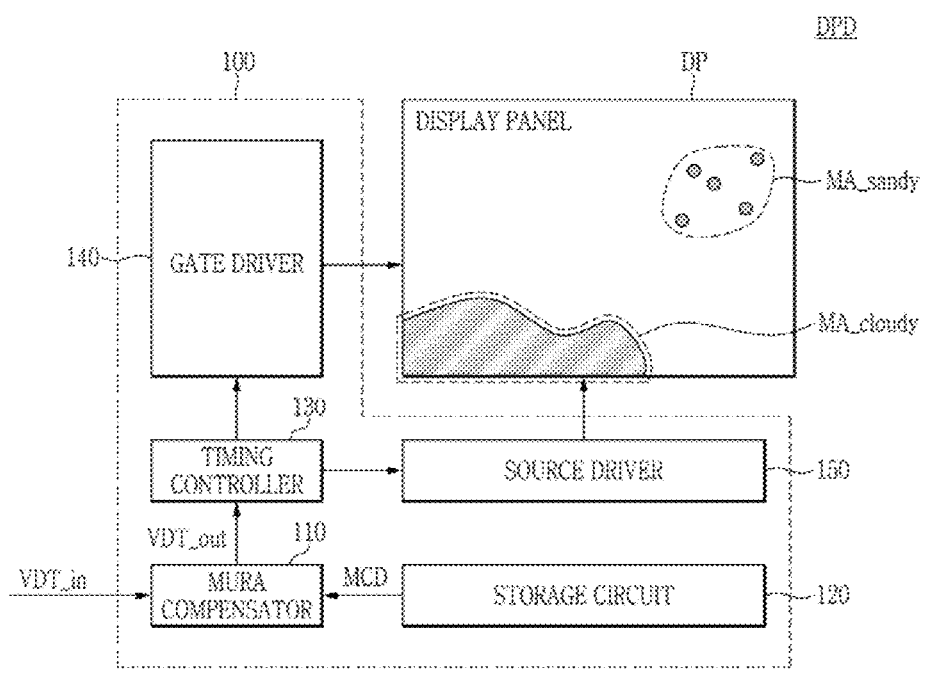
FIG. 1 illustrates a display device according to an embodiment of the disclosure.

In the following detailed description, only certain embodiments of the present invention have been shown and described, simply by way of illustration. Details, such as specific configurations and structures, are provided simply to provide a general understanding of the embodiments of the disclosure. Therefore, variations of the embodiments described herein may be performed by those skilled in the art without departing from the technical spirit and scope of the disclosure. Furthermore, descriptions of well-known functions and structures are omitted for clarity and brevity. The configurations in the following drawings or detailed description may be associated with components other than those shown in the drawings or described in the detailed description. As used herein, the terms are defined in light of the functions of the disclosure and are not limited to any particular function. The definitions of terms may be determined based on what is described in the detailed description.

The components described by reference to terms, such as driver or block as used in the detailed description may be implemented in software, hardware, or a combination thereof. For example, software may be machine code, firmware, embedded code, and application software. For example, the hardware may include electrical circuits, electronic circuits, processors, computers, integrated circuit cores, pressure sensors, inertial sensors, microelectro mechanical systems (MEMS), passive devices, or combinations thereof.

In one or more embodiments of the disclosure described below, a hardware approach is described as an example. However, since the one or more embodiments of the disclosure include technology that uses both hardware and software, the various embodiments of the present disclosure do not exclude a software-based approach.

In addition, in the disclosure, in order to determine whether a specific condition is satisfied or fulfilled, an expression of more than or less than may be used, but this is only a description for expressing an example, and does not exclude description of more than or equal to or less than or equal to. A condition described as 'more than or equal to' may be replaced with 'more than', a condition described as 'less than or equal to' may be replaced with 'less than', and a condition described as 'more than or equal to and less than' may be replaced with 'more than and less than or equal to'. In addition, hereinafter, 'A' to 'B' means at least one of elements from A (including A) and to B (including B).

The terms "include" and "comprise", and the derivatives thereof refer to inclusion without limitation. The term "or" is an inclusive term meaning "and/or". The phrase "associated with," as well as derivatives thereof, refer to include, be included within, interconnect with, contain, be contained within, connect to or with, couple to or with, be communicable with, cooperate with, interleave, juxtapose, be proximate to, be bound to or with, have, have a property of, have a relationship to or with, or the like. The term "controller" refers to any device, system, or part thereof that controls at least one operation. Such a controller may be implemented in hardware or a combination of hardware and software and/or firmware. The functionality associated with any particular controller may be centralized or distributed, whether locally or remotely. The phrase "at least one of," when used with a list of items, means that different combinations of one or more of the listed items may be used, and only one item in the list may be needed. For example, "at least one of A, B, and C" includes any of the following combinations: A, B, C, A and B, A and C, B and C, and A and B and C, and any variations thereof. The expression "at least one of a, b, or c" may indicate only a, only b, only c, both a and b, both a and c, both b and c, all of a, b, and c, or variations thereof. Similarly, the term "set" means one or more. Accordingly, the set of items may be a single item or a collection of two or more items.

The embodiments may be described and illustrated in terms of blocks, as shown in the drawings, which carry out a described function or functions. These blocks, which may be referred to herein as a compression module, a bit-width reduction module, or the like may be physically implemented by analog and/or digital circuits including one or more of a logic gate, an integrated circuit, a microprocessor, a microcontroller, a memory circuit, a passive electronic component, an active electronic component, an optical component, and the like, and may also be implemented by or driven by software and/or firmware (configured to perform the functions or operations described herein). The circuits may, for example, be embodied in one or more semiconductor chips, or on substrate supports such as printed circuit boards and the like. Circuits included in a block may be implemented by dedicated hardware, or by a processor (e.g., one or more programmed microprocessors and associated circuitry), or by a combination of dedicated hardware to perform some functions of the block and a processor to perform other functions of the block. Each block of the embodiments may be physically separated into two or more interacting and discrete blocks. Likewise, the blocks of the embodiments may be physically combined into more complex blocks.

FIG. 1 is a block diagram illustrating a display device according to an embodiment of the disclosure. Referring to FIG. 1, a display device DPD may include a display driving circuit 100 and a display panel DP. The display device DPD may correspond to an electronic device configured to display image information, such as a monitor, TV, laptop, tablet PC, smartphone, and navigation system.

The display panel DP may be connected to the display driving circuit 100 through a plurality of gate lines and a plurality of data lines. The display panel DP may include a plurality of pixels connected with the plurality of gate lines and the plurality of data lines. Each of the plurality of pixels may display one of the primary colors in response to an electrical signal provided by the display driving circuit 100. Primary colors may include red, green, and blue. However, the scope of the disclosure is not limited thereto.

In an embodiment, the display panel DP may be one of various types of panels, such as a liquid crystal display (LCD) panel, an organic light emitting display (OLED) panel, an electrophoretic display panel, and an electrowetting display panel. However, the scope of the disclosure is not limited thereto.

In an embodiment, even though the display driving circuit 100 controls the plurality of pixels of the display panel DP based on the same gray level and the same data signal, the luminance represented by the plurality of pixels may be different. In other words, luminance non-uniformity, so-called mura (むら) or speckles, may occur on the display panel DP due to process deviations of the DP, noises in the electrical signal, and the like.

The display driving circuit 100 may compensate mura of the display panel DP. More specifically, the display driving circuit 100 may adjust an electrical signal to be provided to the display panel DP such that each of the plurality of pixels of the display panel DP represents correct luminance (that is, intended luminance). In the following description, the configuration and operation of the display driving circuit 100 that compensates mura of the display panel DP will be described in detail.

As shown in FIG. 1, the display driving circuit 100 may include a mura compensator 110, a storage circuit 120, a timing controller 130, a gate driver 140, and a source driver 150.

The mura compensator 110 may receive input video data VDT_in from one of various types of electronic devices, such as an Application Processor (AP) or a Graphic Processing Unit (GPU). In this case, the input video data VDT_in may include data for controlling each of the plurality of pixels on the display panel DP.

The storage circuit 120 may store one or more 'mura compensation data' MCD. An embodiment (in which the storage circuit 120 is included in the display driving circuit 100) will be described below. However, the scope of the disclosure is not limited to this, and the storage circuit 120 may exist outside of the display driving circuit 100.

The mura compensation data MCD may include compensation values for pixels of the display panel DP. In an embodiment, the mura compensation data MCD may be implemented in a form of a look-up table containing compensation values. An embodiment will be described below in which mura compensation data MCD is implemented in a form of a lookup table. However, the scope of the disclosure is not limited thereto.

In addition, an embodiment will be described below in which a single compensation value is applied to the mura compensation for a single pixel. However, the scope of the disclosure is not limited to this, and a single compensation value may be used to mura compensation for a plurality of pixels, for example, that are adjacent to each other. For example, one compensation value may be used to compensate mura for four neighboring pixels that form a 2 by 2 matrix structure, or nine neighboring pixels that form a 3 by 3 matrix structure. In other words, the scope of this disclosure is not limited to the specific ways in which the compensation values included in the mura compensation data MCD are used.

In an embodiment, the storage circuit 120 may store the mura compensation data MCD in a compressed form. Thus, the capacity of mura compensation data MCD stored in the storage circuit 120 may be reduced.

In an embodiment, the storage circuit 120 may store the mura compensation data MCD in a compressed form of each spatial frequency component. For example, the storage circuit 120 may store a plurality of mura compensation data compressed by different compression algorithms for different spatial frequencies. In this case, an optimal compression algorithm may be applied for each component of the spatial frequency, so that the capacity of mura compensation data MCD stored in the storage circuit 120 may be minimized. The specific manner in which the mura compensation data is stored in the storage circuit 120 in the compressed form for each spatial frequency component will be described in detail with reference to the following drawings.

In an embodiment, the storage circuit 120 may store a plurality of mura compensation data MCD for different gray levels. In this case, the mura compensator 110 may interpolate the compensation values stored in the plurality of mura compensation data to determine a compensation value corresponding to the gray level in the input video data VDT_in. However, a manner in which one mura compensation data for one gray level is stored in the storage circuit 120 and is used will be described. However, the scope of the disclosure is not limited thereto.

In an embodiment, the storage circuit 120 may store a plurality of mura compensation data MCD for sub-pixels of different colors. However, a manner in which one mura compensation data corresponding to a sub-pixel of one color is stored in the storage circuit 120 and used will be described below. In the following descriptions, the pixels on the display panel DP may refer to sub-pixels of the same color. However, the scope of the disclosure is not limited thereto.

The mura compensator 110 may receive mura compensation data MCD from the storage circuit 120. The mura compensator 110 may perform a mura compensation operation on the input video data VDT_in based on the mura compensation data MCD. That is, based on the mura compensation data MCD, the mura compensator 110 may generate output video data VDT_out from the input video data VDT_in. The specific configuration and operation of the mura compensator 110 will be described in more detail with reference to FIGS. 16 and 17 below.

In one embodiment, the mura compensator 110 may perform an operation of weighted sum on the data for each of the plurality of pixels represented by the input video data VDT_in and the compensation values for each of the plurality of pixels represented by the mura compensation data MCD, in order to generate the output video data VDT_out. However, the scope of the disclosure is not limited thereto, and the mura compensation operation may be performed by using any type of operations, such as a sum operation and a product operation.

In an embodiment, when the mura compensation data MCD is in a compressed format, the mura compensator 110 may decompress the mura compensation data MCD, and then, perform the mura compensation operation on the input video data VDT_in.

The timing controller 130 may receive output video data VDT_out from the mura compensator 110. Based on the output video data VDT_out, the timing controller 130 may control the gate driver 140 and the source driver 150.

The gate driver 140 may be connected to the display panel DP via a plurality of gate lines, and the source driver 150 may be connected to the display panel DP via a plurality of data lines. The source driver 150 may control a plurality of data lines connected with the display panel DP based on control signals provided by the timing controller 130 or data provided by the timing controller 130 (for example, the output video data VDT_out). In other words, in an embodiment, each of the pixels of the display panel DP may be operated in response to the output video data VDT_out (that is, mura-compensated data) rather than the input video data VDT_in.

In an embodiment, the display panel DP may include a sandy mura area 'MA_sandy' and a cloudy mura area 'MA_cloudy,' as shown in FIG. 1. The sandy mura area MA_sandy may include some non-adjacent pixels that have different luminances from other pixels on the display panel DP. The cloudy mura area MA_cloudy may include a plurality of adjacent pixels that have different luminances from other pixels on the display panel DP. In this case, the sandy mura area MA_sandy may be visible to the user as 'mura points' on the display panel DP, and the cloudy mura area MA_cloudy may be visible to the user as 'mura planes' on the display panel DP, as shown in FIG. 1.

In an embodiment, the compensation values for compensating the cloudy mura area MA_cloudy among the compensation values of the mura compensation data MCD may have high (or relatively higher) correlation with each other. For example, among mura compensation values for compensating the cloudy mura area MA_cloudy, the mura compensation values corresponding to adjacent pixels on the display panel DP may have similar values. On the other hand, among the compensation values of the mura compensation data MCD, the compensation values for compensating the sandy mura area MA_sandy may have less (or relatively lower) correlation with each other. For example, each of the mura compensation values for compensating the sandy mura area MA_sandy may be determined independently of whether the corresponding pixel location is adjacent or not. In other words, the spatial frequency of the mura compensation values for compensating the cloudy mura area MA_cloudy may be low, and the spatial frequency of the mura compensation values for compensating the sandy mura area MA_sandy may be high.

In an embodiment, the storage circuit 120 may store the plurality of compressed mura compensation data MCD for each size of the spatial frequency (or periodicity). For example, storage circuit 120 may store a compressed high spatial frequency component, and a compressed low spatial frequency component. In this case, the mura compensation data stored in the storage circuit 120 may be compressed and stored in a manner optimized for the size of the spatial frequency. Thus, according to an embodiment of the disclosure, the capacity of data for a mura compensation operation stored in the storage circuit 120 may be minimized. A specific method of storing the compressed mura compensation data based on the spatial frequency in the storage circuit 120 will be described in more detail with reference to FIGS. 2 to 15 below.

Figure 2:
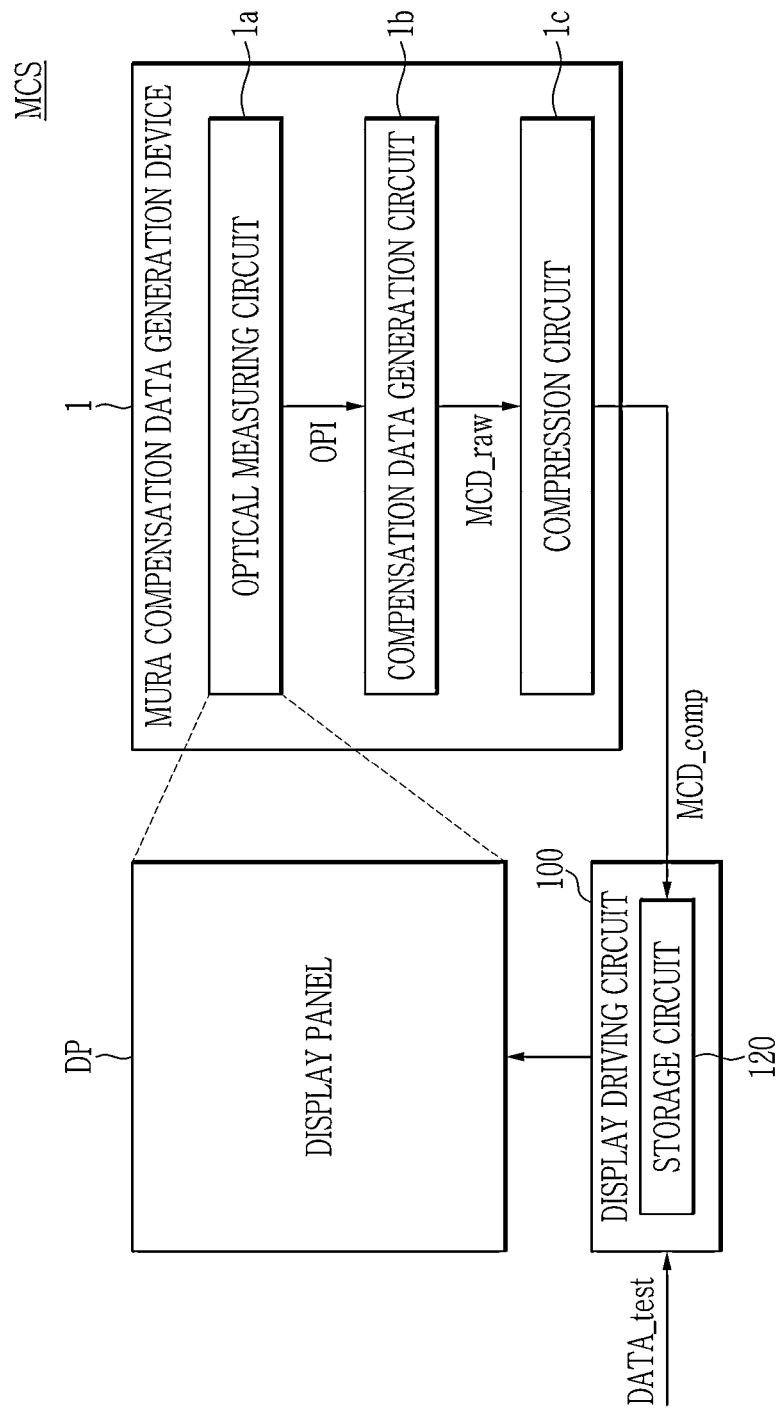
FIG. 2 illustrates a mura compensating system for generating mura compensation data of FIG. 1 according to the embodiment.

FIG. 2 is a block diagram illustrating a mura compensating system for generating the mura compensation data of FIG. 1 according to an embodiment. Referring to FIGS. 1 and 2, a mura compensation system MCS may include the display panel DP, the display driving circuit 100, and a mura compensation data generation device 1. The display panel DP and the display driving circuit 100 may be included in the display device DPD. A detailed description of the configuration and function of the display device DPD described above will be omitted.

The display driving circuit 100 may receive test data DATA_test from an outside, such as an an external electronic device connected to the mura compensation system MCS. Based on the test data DATA_test, the display driving circuit 100 may control each of the plurality of pixels of the display panel DP to the same luminance. In other words, the display driving circuit 100 may provide a signal of the same size to each column of the display panel DP based on the test data DATA_test. More specifically, the source driver 150 may provide a signal of the same size to a plurality of data lines based on the test data DATA_test. In this case, an ideal display panel DP (that is, a display panel that does not including mura area) may be able to express uniform luminance.

The mura compensation data generation device 1 may identify whether the display panel DP expresses uniform luminance. In other words, the mura compensation data generation device 1 may identify the mura of the display panel DP. For example, the mura compensation data generation device 1 may include an optical measuring circuit 1a. The optical measuring circuit 1a may generate optical information OPI representing an image output through the display panel DP. In this case, the optical information OPI may include the luminance values represented by the pixels of the display panel DP.

The mura compensation data generation device 1 may generate information for compensating for mura of the display panel DP, based on the optical information OPI. For example, the mura compensation data generation device 1 may include a compensation data generation circuit 1b. Based on the optical information OPI, the compensation data generation circuit 1b may determine a luminance level to be compensated for each of the pixels of the display panel DP.

The compensation data generation circuit 1b may generate raw mura compensation data MCD_raw representing the luminance level determined to be compensated for each pixel. A method or a manner in which the compensation data generation circuit 1b determines the luminance level to be compensated for each of the pixels of the display panel DP will be described in more detail with reference to FIG. 3 below.

The mura compensation data generation device 1 may compress the raw mura compensation data MCD_raw and store the compressed raw mura compensation data MCD_raw in the display driving circuit 100. For example, the mura compensation data generation device 1 may include a compression circuit 1c. The compression circuit 1c may compress the raw mura compensation data MCD_raw to generate compressed mura compensation data MCD_comp. The compression circuit 1c may transmit the compressed mura compensation data MCD_comp to the storage circuit 120 of the display driving circuit 100, and thus, may store the compressed mura compensation data MCD_comp in the storage circuit 120 of the display driving circuit 100.

In this way, the storage circuit 120 may store the compressed mura compensation data MCD_comp. In this case, the display driving circuit 100 may decompress the compressed mura compensation data MCD_comp to generate the raw mura compensation data MCD_raw, and may perform a mura compensation operation on the input video data VDT_in, based on the raw mura compensation data MCD_raw. However, the scope of the disclosure is not limited thereto.

Figure 3:
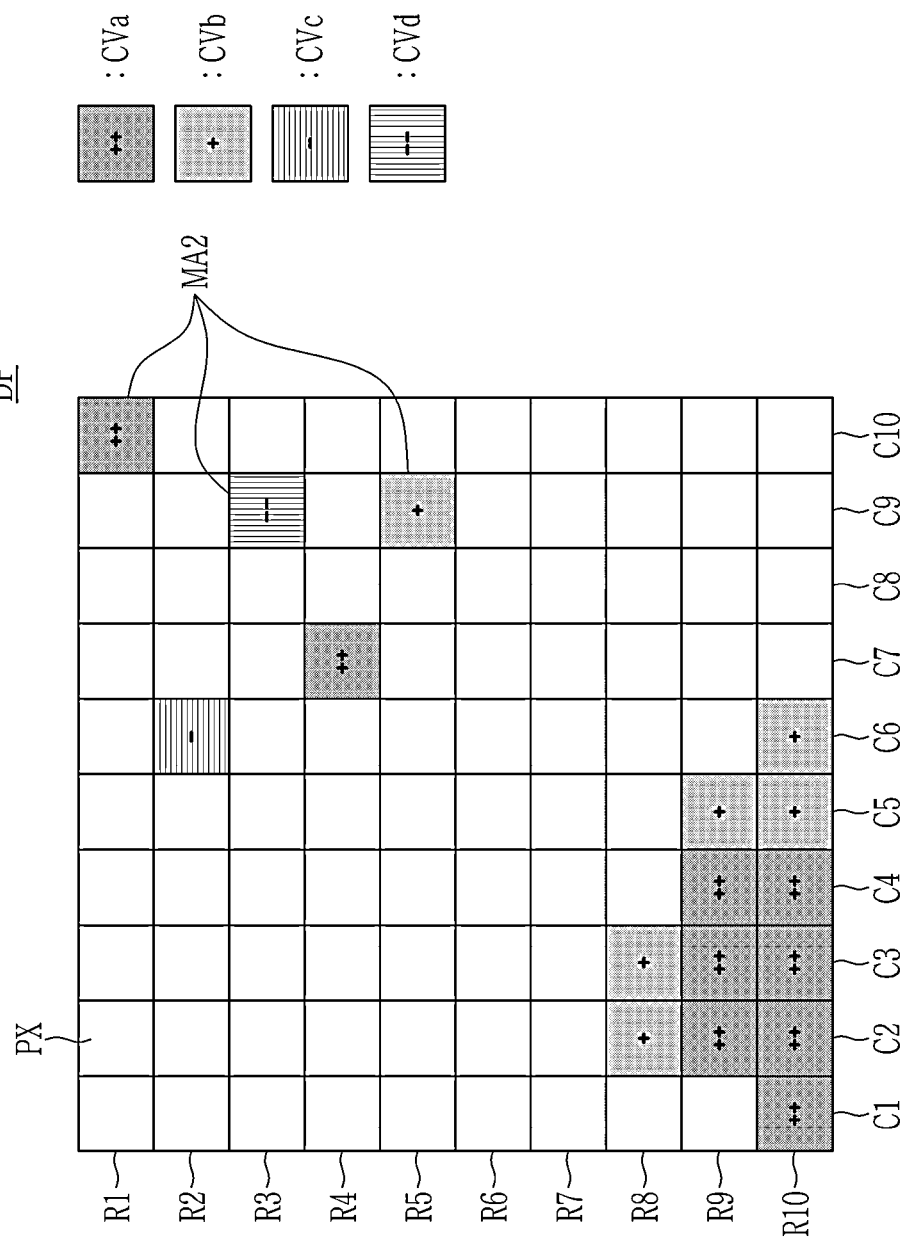
FIG. 3 illustrates an operation of a compensation data generation circuit of FIG. 2 in more detail.

FIG. 3 is a diagram illustrating the operation of the compensation data generation circuit 1b of FIG. 2 in more detail. Referring to FIGS. 1 to 3, the compensation data generation circuit 1b may obtain luminance information for each of the pixels PX of the display panel DP based on the optical information OPI.

For example, the compensation data generation circuit 1b may identify, based on optical information OPI, that the pixels located in [the first row R1, the tenth column C10] of the display panel DP, the pixels in [R4, C7], the pixels in [R9, C2 to C4], and the pixels in [R10, C1 to C4] (hereinafter, the pixels shown in dark gray) represent first luminance (corresponding to the value CVa).

The compensation data generation circuit 1b may identify, based on optical information OPI, that the pixels in [R5, C9], the pixels in [R8, C2 to C3], the pixel in [R9, C5], and the pixels in [R10, C5 to C6] (hereinafter, the pixels shown in gray) represent second luminance (corresponding to CVb).

Similarly, the compensation data generation circuit 1b may identify, based on optical information OPI, that the pixel in [R2, C6] (hereinafter, the pixels shown as horizontal stripes) represent third luminance (corresponding to CVc), and that the pixel in [R3, C9] (hereinafter, the pixel shown as vertical stripes) represent fourth luminance (corresponding to CVd).

In other words, based on optical information OPI, the compensation data generation circuit 1b may identify mura caused by a difference in luminance of the pixels on the display panel DP.

The compensation data generation circuit 1b may generate, based on the optical information OPI, compensation values for pixels that represent luminance higher or lower than 'reference' luminance among the pixels located in the first to tenth rows (R1 to R10) and the first to tenth columns (C1 to C10) of the display panel DP. For example, the compensation data generation circuit 1b may generate a compensation value (or at least one compensation value) that allows all pixels to represent the reference luminance.

An embodiment will be described below in which first luminance is lower than second luminance, the second luminance is lower than the reference luminance, the reference luminance is lower than the third luminance, and the third luminance is lower than fourth luminance. That is, the order is this: the first luminance<the second luminance<the reference luminance<the third luminance<the fourth luminance. However, the scope of the disclosure is not limited thereto.

In an embodiment, the compensation data generation circuit 1b may generate raw mura compensation data MCD_raw, which includes compensation values for pixels having luminance higher (or lower in another embodiment) than the reference luminance. In this case, the area (for example, a cell of the lookup table) of the raw mura compensation data MCD_raw corresponding to the pixels depicted in dark gray (that is, pixels representing the first luminance in FIG. 3) may store a first compensation value CVa; an area of the raw mura compensation data MCD_raw corresponding to pixels depicted in gray (that is, pixels representing the second luminance) may store a second compensation value CVb; an area of the raw mura compensation data MCD_raw corresponding to pixels depicted in horizontal stripes (that is, pixels representing the third luminance) may store a third compensation value CVc; and an area of the raw mura compensation data MCD_raw corresponding to pixels represented by vertical stripes (that is, pixels representing the fourth luminance) may store a fourth compensation value CVd. In this case, the display driving circuit 100 may control the display panel DP to output an image of uniform luminance based on the four compensation values (CVa, CVb, CVc, and CVd). However, the scope of the disclosure is not limited thereto.

Figure 4:
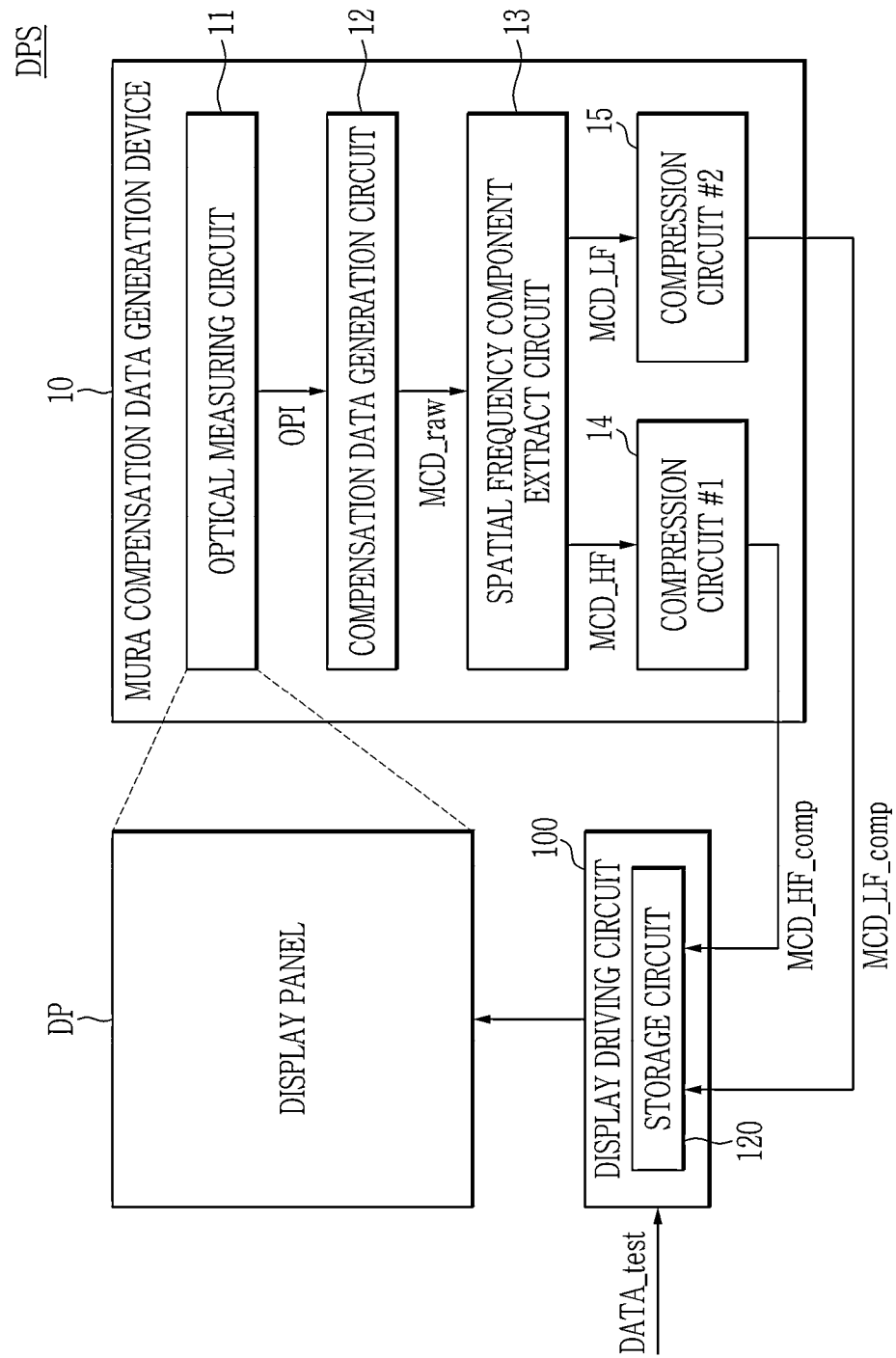
FIG. 4 illustrates the mura compensating system configured to generate mura compensation data of FIG. 1 according to the embodiment of the disclosure.

FIG. 4 is a block diagram illustrating the mura compensating system MCS configured to generate the mura compensation data MCD of FIG. 1 according to an embodiment of the disclosure. Referring to FIGS. 1 and 4, the mura compensation system MCS may include the display panel DP, the display driving circuit 100, and the mura compensation data generation device 10. As shown in FIG. 4, The mura compensation data generation device 10 may include an optical measuring circuit 11, a compensation data generation circuit 12, a spatial frequency component extract circuit 13, a compression circuit #1 14, and a compression circuit #2 15. Since the configuration and operation of the display panel DP, the display driving circuit 100, the optical measuring circuit 11, and the compensation data generation circuit 12 are similar to those previously described with reference to FIG. 2, a detailed description will be omitted.

The spatial frequency component extract circuit 13 may receive raw mura compensation data MCD_raw from the compensation data generation circuit 12. The spatial frequency component extract circuit 13 may extract the high spatial frequency component MCD_HF (from the raw mura compensation data MCD_raw) and the low spatial frequency component MCD_LF (from the raw mura compensation data MCD_raw). That is, the spatial frequency component extract circuit 13 may classify the high spatial frequency components (for example, components of compensation values to compensate the sandy mura area MA_sandy) and the low spatial frequency components (for example, components of compensation values to compensate the cloudy mura area MA_cloudy) from the raw mura compensation data MCD_raw.

Figure 5:
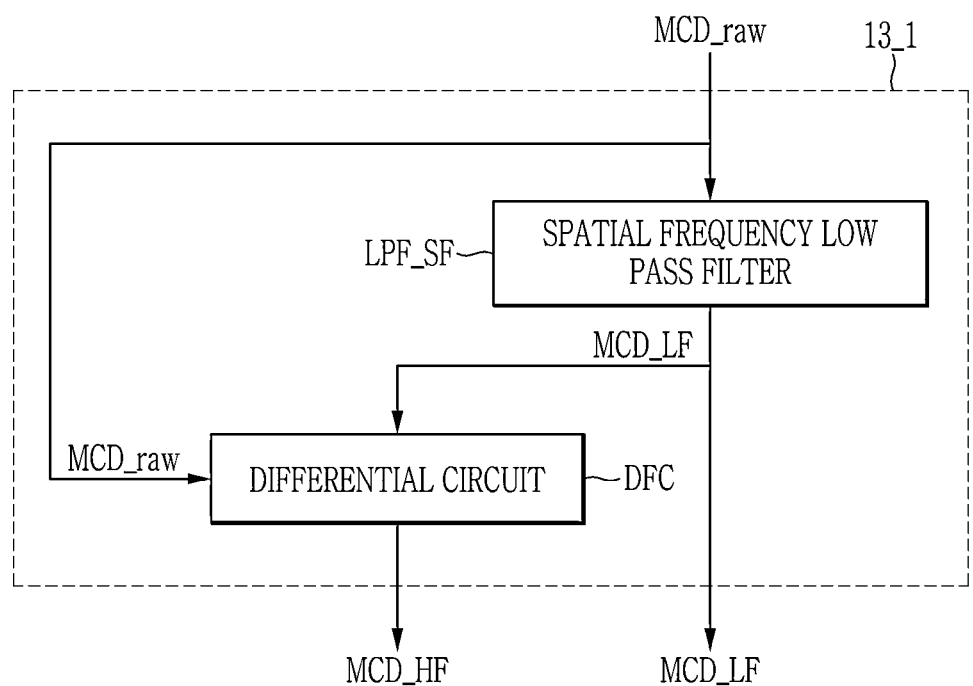
FIG. 5 illustrates a spatial frequency component extract circuit of FIG. 4, implemented in accordance with an embodiment.

In an embodiment, the spatial frequency component extract circuit 13 may include a spatial frequency low pass filter (for example, LPF_SF in FIG. 5). In this case, the spatial frequency component extract circuit 13 may provide the raw mura compensation data MCD_raw into the spatial frequency low pass filter to extract the low spatial frequency component MCD_LF. Then, the spatial frequency component extract circuit 13 may extract the high spatial frequency component MCD_HF based on the raw mura compensation data MCD_raw and the low spatial frequency component MCD_LF. However, the scope of the disclosure is not limited to any particular implementation method of the spatial frequency component extract circuit 13. For example, the spatial frequency component extract circuit 13 may include a spatial frequency high pass filter. However, an embodiment will be described below in which the spatial frequency component extract circuit 13 includes a spatial frequency low pass filter.

In an embodiment, the spatial frequency component extract circuit 13 may extract the high spatial frequency component MCD_HF based on the difference between the raw mura compensation data MCD_raw and the low spatial frequency component MCD_LF. The configuration of the spatial frequency component extract circuit 13, which extracts the high spatial frequency component MCD_HF based on the difference between the raw mura compensation data MCD_raw and the low spatial frequency component MCD_LF, will be described in more detail with reference to FIG. 5 below.

In an embodiment, the spatial frequency component extract circuit 13 may extract the high spatial frequency component MCD_HF based on the difference between the result of compressing and decompressing the low spatial frequency component MCD_LF (that is, the result of compressing the low spatial frequency component MCD_LF and decompressing the compressed low spatial frequency component MCD_LF again) and the raw mura compensation data MCD_raw. In this case, errors caused by the compression and the decompression of the low spatial frequency component MCD_LF may be reflected in the high spatial frequency component MCD_HF. The configuration of the spatial frequency component extract circuit 13, which extracts the high spatial frequency component MCD_HF (based on the difference between the result of compressing and decompressing the low spatial frequency component MCD_LF and the raw mura compensation data MCD_raw) will be described in more detail with reference to FIG. 18 below. However, an embodiment will be described below in which the spatial frequency component extract circuit 13 extracts the high spatial frequency component MCD_HF based on the difference between the raw mura compensation data MCD_raw and the low spatial frequency component MCD_LF.

In an embodiment, the capacity of the high spatial frequency component MCD_HF and the low spatial frequency component MCD_LF may be same. More specifically, for the high spatial frequency component MCD_HF and the low spatial frequency component MCD_LF, the number of compensation values arranged in the row direction may be same as that of the raw mura compensation data MCD_raw. More specifically, for the high spatial frequency component MCD_HF and the low spatial frequency component MCD_LF, the number of compensation values arranged in the column direction may be same as that of the raw mura compensation data MCD_raw. That is, the capacity (or, row size and column size) of the raw mura compensation data MCD_raw, the high spatial frequency component MCD_HF, and the low spatial frequency component MCD_LF may be equal to each other. However, the scope of the disclosure is not limited thereto.

As shown in FIG. 4, the compression circuit #1 14 may compress the high spatial frequency component MCD_HF to generate a compressed high spatial frequency component MCD_HF_comp. For example, the compression circuit #1 14 may compress the high spatial frequency component MCD_HF based on a first compression algorithm.

The compression circuit #2 15 may compress the low spatial frequency component MCD_LF to generate the compressed low spatial frequency component MCD_LF_comp. For example, the compression circuit #2 15 may compress the low spatial frequency component MCD_LF based on a second compression algorithm.

In one embodiment, the compression algorithms used by the compression circuit #1 14 and the compression circuit #2 15 may be different. In other words, the first compression algorithm and the second compression algorithm may be different. For example, the first compression algorithm may be a compression algorithm with a low compression ratio and low compression loss (that is, high recovery rate), while the second compression algorithm may be a compression algorithm with a high compression ratio. In this case, the capacity of the compressed low spatial frequency component MCD_LF_comp may be smaller than the capacity of the compressed high spatial frequency component MCD_HF_comp.

The compression circuit #1 14 may transmit, and thus, store the compressed high spatial frequency component MCD_HF_comp in the storage circuit 120. The compression circuit #2 15 may transmit, and thus, store the compressed low spatial frequency component MCD_LF_comp in the storage circuit 120. The specific configuration and operation of the compression circuit #1 14 and the compression circuit #2 15 will be described in more detail below with reference to FIG. 11.

In this manner, the storage circuit 120 may store the compressed high spatial frequency component MCD_HF_comp and the compressed low spatial frequency component MCD_LF_comp. In this case, the sum of the capacity of the compressed high spatial frequency component MCD_HF_comp and the compressed low spatial frequency component MCD_LF_comp may be less than the capacity of the compressed mura compensation data MCD_comp previously described with reference to FIG. 2. Thus, according to embodiments of the disclosure, the capacity of the storage circuit 120 may be minimized, which is an example advantage of the disclosure. The operation of the display driving circuit 100 based on the compressed high spatial frequency component MCD_HF_comp and the compressed low spatial frequency component MCD_LF_comp will be described in more detail with reference to FIGS. 16 and 17 below.

In an embodiment, FIG. 4 illustrates an embodiment in which the mura compensation data generation device 10 is implemented as a separate device from the display driving circuit 100, but the scope of the disclosure is not limited to this. For example, some configurations of the mura compensation data generation device 10 may be included in the display driving circuit 100. More specifically, one or more of the spatial frequency component extract circuit 13, the compression circuit #1 14, and the compression circuit #2 15 may be included in the display driving circuit 100. In this case, the display driving circuit 100 may store raw mura compensation data MCD_raw in a compressed or uncompressed form as needed (for example, depending on the operating speed or storage capacity of the display driving circuit 100).

FIG. 5 is a block diagram illustrating the spatial frequency component extract circuit 13 of FIG. 4, implemented in accordance with the embodiment. Referring to FIGS. 1, 4, and 5, a spatial frequency component extract circuit 13_1 may include a spatial frequency low pass filter LPF_SF, and a differential circuit DFC. In an embodiment, the spatial frequency component extract circuit 13_1 in FIG. 5 corresponds to the spatial frequency component extract circuit 13 in FIG. 4.

The spatial frequency low pass filter LPF_SF may receive raw mura compensation data MCD_raw. The spatial frequency low pass filter LPF_SF may extract the low spatial frequency component MCD_LF based on the raw mura compensation data MCD_raw.

The differential circuit DFC may receive the raw mura compensation data MCD_raw and low spatial frequency component MCD_LF. The differential circuit DFC may extract the high spatial frequency component MCD_HF based on the difference between the raw mura compensation data MCD_raw and the low spatial frequency component MCD_LF. The operation of the differential circuit DFC is described in more detail with reference to FIGS. 6 to 10 below.

In the following description, the spatial frequency component extract circuit 13 of FIG. 4 may be implemented in a manner similar to the spatial frequency component extract circuit 13_1 of FIG. 5. However, the scope of the disclosure is not limited thereto, and the spatial frequency component extract circuit 13 may be implemented in a manner similar to a spatial frequency component extract circuit described below with reference to FIG. 18.

FIG. 6 illustrates the raw mura compensation data MCD_raw of FIG. 4. Referring to FIGS. 1, 4 to 6, the raw mura compensation data MCD_raw may be implemented in the form of a lookup table for the pixels of the display panel DP. The raw mura compensation data MCD_raw may contain a plurality of compensation values CVs. In this case, each of the plurality of compensation values CVs may be arranged in a different cell of the lookup table. In the following description, the plurality of compensation values CVs may be arranged in a row direction and a column direction within the raw mura compensation data MCD_raw.

Furthermore, the compensation value that is arranged in the $m^{th}$ row and $n^{th}$ column of the raw mura compensation data MCD_raw among the plurality of compensation values CV will be referred to as "CVmn". For example, the compensation values arranged in the first row and the second column of the raw mura compensation data MCD_raw will be referred to as "CV12". However, the scope of the disclosure is not limited thereto.

Each of the plurality of compensation values CVs may be used to perform the mura compensation operation on one or more pixels of the display panel DP. In the following description, an embodiment is described in which each of a plurality of compensation values CVs is used for the mura compensation operation for one pixel of the display panel DP. For example, "CV11" may be used for the mura compensation operation for the pixel in [1, 1] (first row, first column) of the display panel DP, and "CV12" may be used for the mura compensation operation for the pixel in [1, 2] (first row, second column) of the display panel DP. However, the scope of this disclosure is not limited to the number of pixels on the display panel DP for which the compensation values CVs are used. For example, each of a plurality of compensation values CVs may be used to perform the mura compensation operation for the plurality of pixels. More specifically, "CV11" may be used for the mura compensation operation for the pixels arranged in the first and second columns of the first row of the display panel DP and the pixels arranged in the first and second columns of the second row, and "CV12" may be used for the mura compensation operation for the pixels arranged in the third and fourth columns of the first row of the display panel DP and the pixels arranged in the third and fourth columns of the second row.

In an embodiment, an arrangement in the lookup table of the plurality of compensation values CVs may be determined based on an arrangement of the pixels (that is, the pixels to be compensated) corresponding to the plurality of compensation values, respectively, in the display panel DP. However, the scope of the disclosure is not limited thereto.

The spatial frequency component extract circuit 13 may extract the high spatial frequency component and the low spatial frequency component for each row of the raw mura compensation data MCD_raw. For example, the spatial frequency component extract circuit 13 may extract a high spatial frequency component and a low spatial frequency component for the first row ROW1 of the raw mura compensation data MCD_raw based on a compensation value magnitude according to a column number in the first row ROW1 of the raw mura compensation data MCD_raw. However, the scope of the disclosure is not limited thereto, and the spatial frequency component extract circuit 13 may be configured to extract a high spatial frequency component and a low spatial frequency component for each column of the raw mura compensation data MCD_raw.

Hereinafter, an embodiment in which the spatial frequency component extract circuit 13 extracts a high spatial frequency component and a low spatial frequency component for the first row ROW1 of the raw mura compensation data MCD_raw will be described with reference to FIGS. 7, 8, and 10. However, the scope of the disclosure is not limited thereto, and the spatial frequency component extract circuit 13 may extract a high spatial frequency component and a low spatial frequency component for a predetermined raw and column of the raw mura compensation data MCD_raw in a similar manner.

Figure 7:
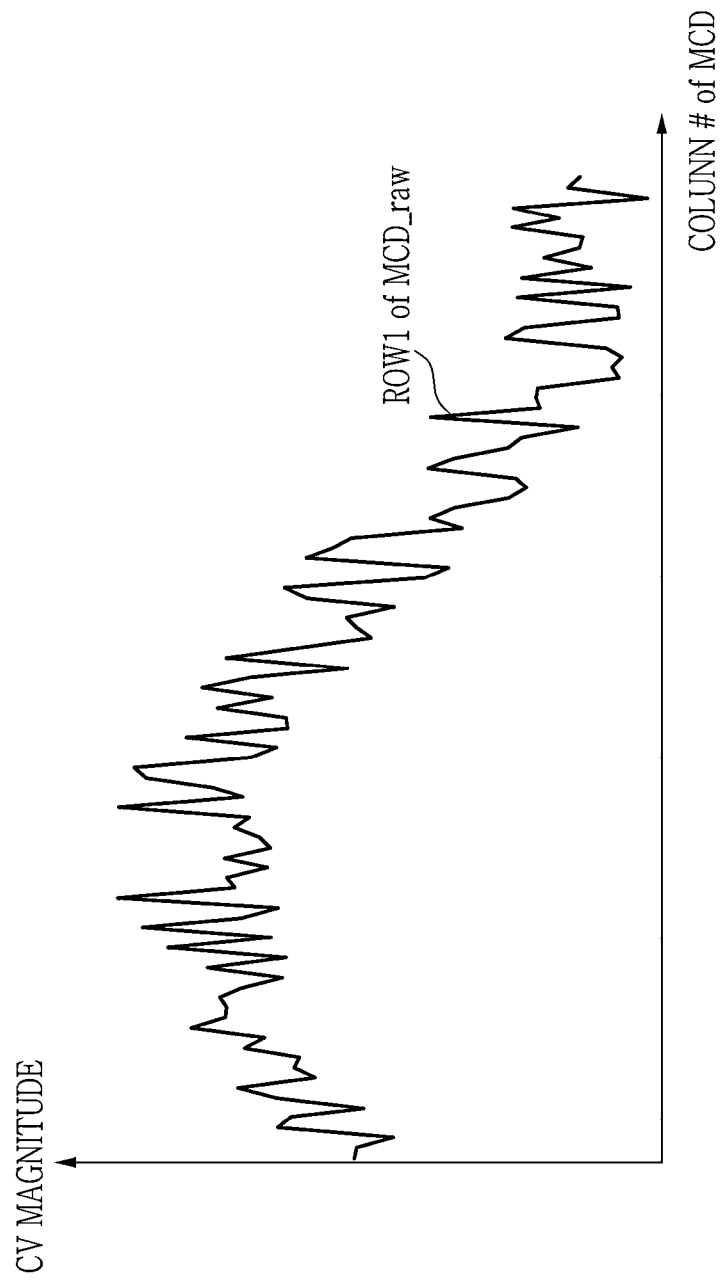
FIG. 7 illustrates a magnitude of a compensation value according to the column number of the first row of the raw mura compensation data of FIG. 6.

FIG. 7 is a graph illustrating a magnitude of a compensation value according to the column number of the first row of the raw mura compensation data of FIG. 6. In FIG. 7, the horizontal axis represents the column number of the raw mura compensation data MCD_raw and the vertical axis represents the magnitude of the compensation value CV.

Referring to FIG. 1, and FIG. 4 to FIG. 7, the first row ROW1 of the raw mura compensation data MCD_raw may store compensation values of an variable (inconsistent) magnitude depending on the column number.

In an embodiment, each of the compensation values of the raw mura compensation data MCD_raw may be determined as a sum of (1) a compensation value to compensation the cloudy mura area MA_cloudy and (2) a compensation value to compensation the sandy mura area MA_sandy. In this way, each of the compensation values in the raw mura compensation data MCD_raw may include both the high spatial frequency component and the low spatial frequency component.

In an embodiment, the high spatial frequency component MCD_HF of the raw mura compensation data MCD_raw may refer to a component that has a large fluctuation in compensation value magnitude according to the column number. On the other hand, the low spatial frequency component MCD_LF of the raw mura compensation data MCD_raw may refer to a component with small fluctuation in the magnitude of the compensation value according to column numbers. Thus, the high spatial frequency component MCD_HF and the low spatial frequency component MCD_LF of the raw mura compensation data MCD_raw may be determined based on the magnitude of the plurality of compensation values and the arrangement of the plurality of compensation values in the lookup table. The high spatial frequency component MCD_HF and the low spatial frequency component MCD_LF of the raw mura compensation data MCD_raw will be described in more detail with reference to FIGS. 8 and 10 below.

The spatial frequency component extract circuit 13 may perform a spatial frequency low-pass filtering operation to extract a low spatial frequency component for the first row ROW1 of the raw mura compensation data MCD_raw.

In an embodiment, the spatial frequency component extract circuit 13 may perform a spatial frequency low-pass filtering operation by a moving average filtering operation method. For example, the spatial frequency component extract circuit 13 may extract the low spatial frequency component of the first row ROW1 of the raw mura compensation data MCD_raw by computing an average of the compensation values for a plurality of adjacent columns of the first row ROW1 of the raw mura compensation data MCD_raw. However, the scope of the disclosure is not limited thereto.

Figure 8:
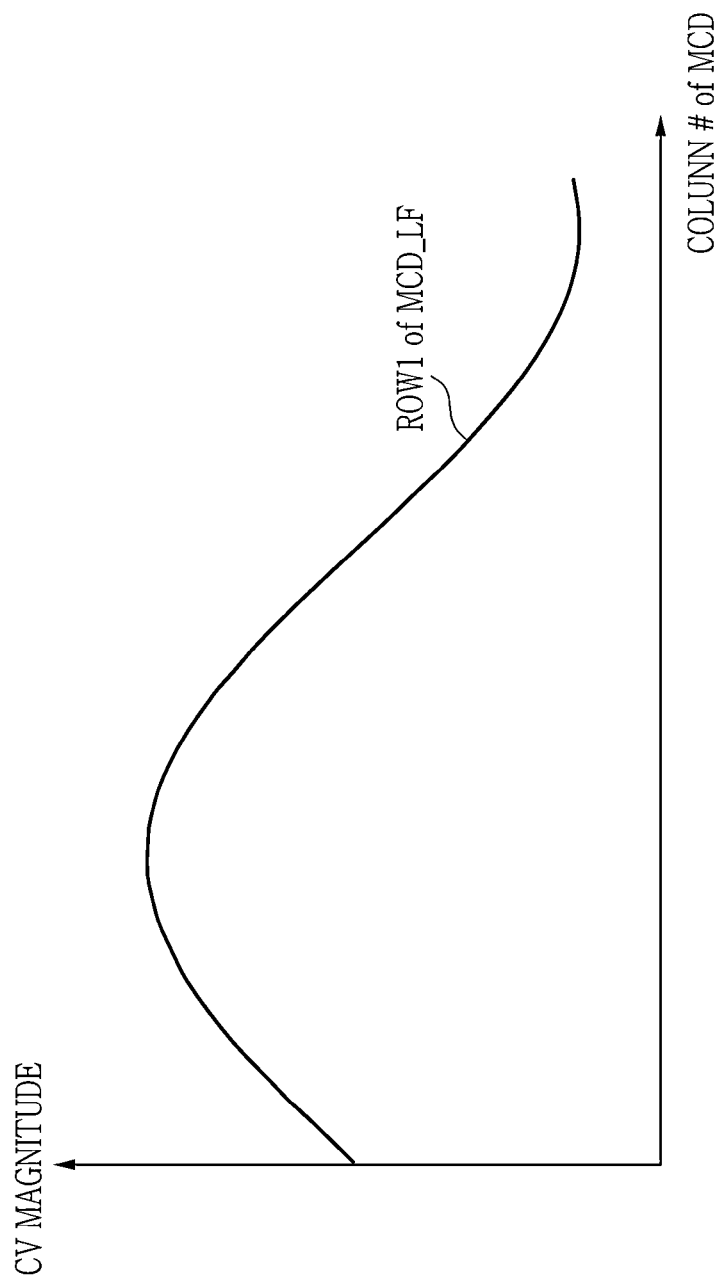
FIG. 8 illustrates a magnitude of a compensation value of a low spatial frequency component extracted from the first row of the raw mura compensation data of FIG. 6.

FIG. 8 is a graph illustrating a magnitude of a compensation value of a low spatial frequency component extracted from the first row of raw mura compensation data of FIG. 6. In other words, the horizontal axis in FIG. 8 represents the column number of the low spatial frequency component MCD_LF, and the vertical axis represents the magnitude of the compensation value CV.

Referring to FIGS. 1, and 4 to 8, the compensation values corresponding to adjacent column numbers in the first row of the low spatial frequency component MCD_LF may have similar magnitudes to each other.

In other words, the compensation values of the low spatial frequency component MCD_LF may be highly correlated with each other. Therefore, the low spatial frequency component MCD_LF may have less compression loss, even if it is compressed by a compression algorithm with a higher compression ratio.

Figure 9:
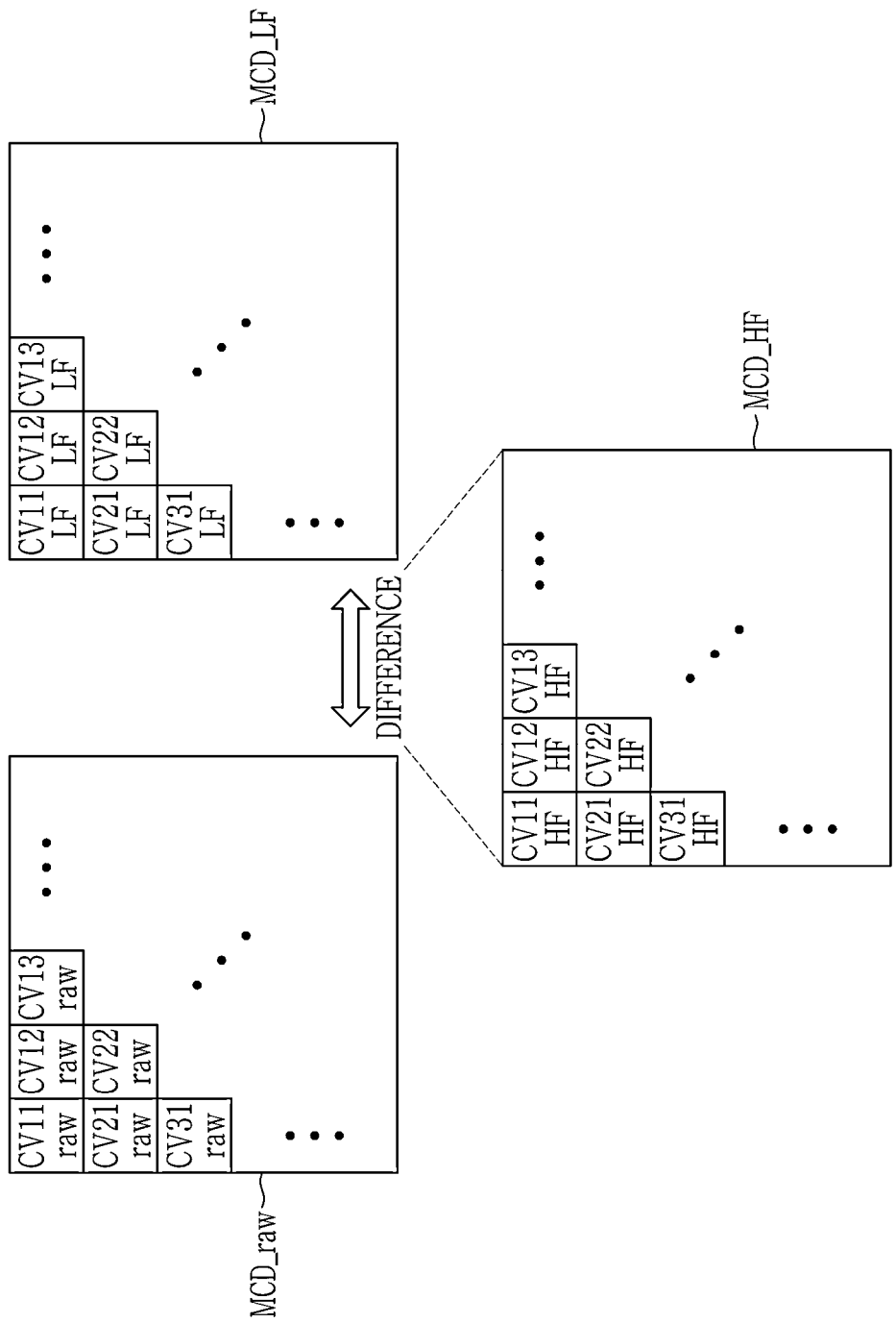
FIG. 9 illustrates the relationship between the raw mura compensation data, the low spatial frequency component, and the high spatial frequency component of FIG. 4.

FIG. 9 is a diagram illustrating the relationship between the raw mura compensation data MCD_raw, the low spatial frequency component MCD_LF, and the high spatial frequency component MCD_HF of FIG. 4. Hereafter, the compensation values arranged in the $m^{th}$ row and the $n^{th}$ column of the raw mura compensation data MCD_raw will be referred to as "CVmnraw". For example, the compensation values arranged in the first row and the second column of the raw mura compensation data MCD_raw will be referred to as "CV12raw". Similarly, the compensation values arranged in the $m^{th}$ row and the $n^{th}$ column of the low spatial frequency component MCD_LF will be referred to as "CVmnLF", and the compensation values arranged in the $m^{th}$ row and the $n^{th}$ column of the high spatial frequency component MCD_HF will be referred to as "CVmnHF". However, the scope of the disclosure is not limited thereto.

In an embodiment, the spatial frequency component extract circuit 13 may extract the high spatial frequency component MCD_HF based on the difference between the raw mura compensation data MCD_raw and the low spatial frequency component MCD_LF. More specifically, the spatial frequency component extract circuit 13 may determine each of the compensation values of the high spatial frequency component MCD_HF based on the difference between the compensation values of the corresponding positions of the raw mura compensation data MCD_raw and the low spatial frequency component MCD_LF (that is, the compensation values having the same row number and column number as each other). For example, the spatial frequency component extract circuit 13 may determine the compensation value CV11HF of the first row and the first column of the high spatial frequency component MCD_HF based on the difference between the compensation value, that is, CV11raw, of the first row and the first column of raw mura compensation data MCD_raw and the compensation value, that is, CV11LF, of the first row and the first column of the low spatial frequency component MCD_LF. However, the scope of the disclosure is not limited to this, and the spatial frequency component extract circuit 13 may similarly determine compensation values arranged in any row and any column of the high spatial frequency component MCD_HF.

Figure 10:
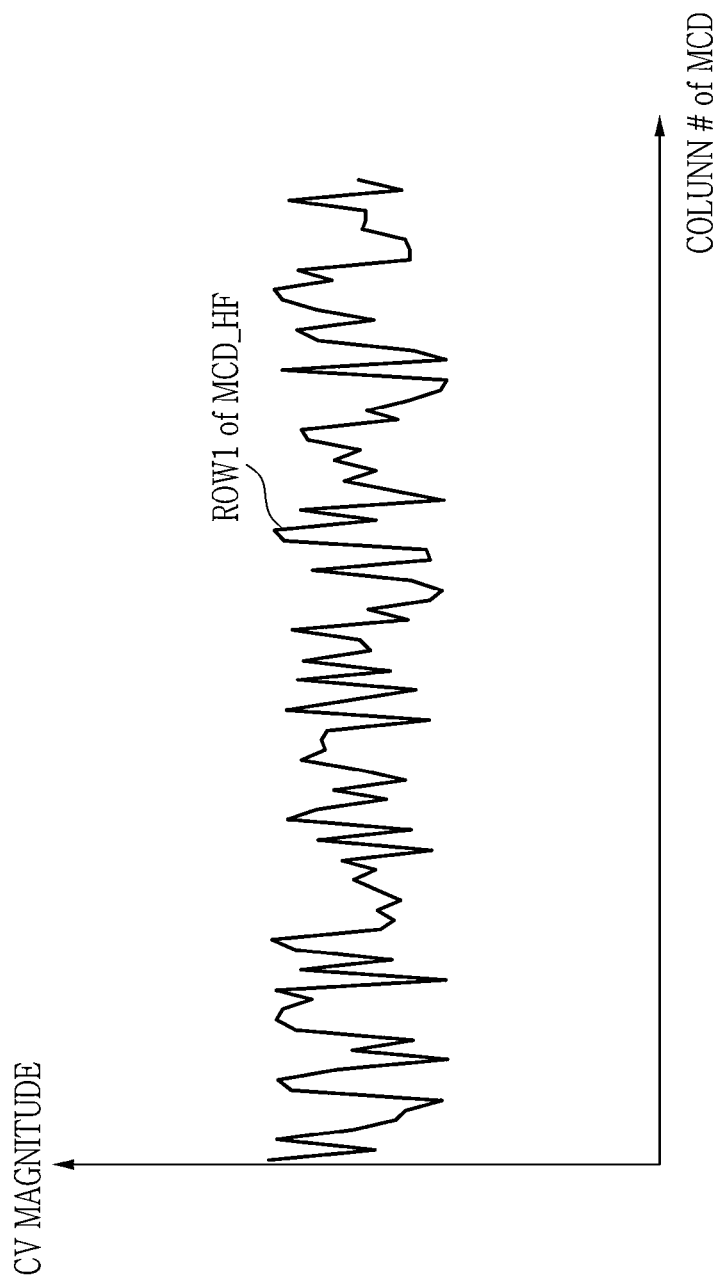
FIG. 10 illustrates a magnitude of a compensation value of the high spatial frequency component extracted from the first row of the raw mura compensation data of FIG. 6.

FIG. 10 is a graph illustrating a size (magnitude) of a compensation value of the high spatial frequency component extracted from the first row of the raw mura compensation data of FIG. 6. That is, the horizontal axis in FIG. 10 represents the column number of the first row of the high spatial frequency component MCD_HF, and the vertical axis represents the magnitude of the compensation value Cv.

Referring to FIGS. 1, and 4 to 10, the compensation values in the first row of the high spatial frequency component MCD_HF may have a compensation value of an inconsistent magnitude depending on the column number.

In other words, each compensation value of the high spatial frequency component MCD_HF may have a (relatively) low correlation with each other, for example, compared with FIG. 8 showing a relatively high correlation in the compensation values of the low spatial frequency component MCD_LF. Therefore, the high spatial frequency component MCD_HF will need to be compressed by using a compression algorithm with a relatively low compression ratio to minimize compression loss.

In an embodiment, each of the compensation values in the high spatial frequency component MCD_HF may have a similar magnitude. For example, a difference between the largest compensation value and the smallest compensation value in the compensation values of the high spatial frequency component MCD_HF (shown in FIG. 10) may be smaller than a difference between the largest compensation value and the smallest compensation value in the compensation values of the low spatial frequency component MCD_LF (shown in FIG. 8). In this case, even though the high spatial frequency component MCD_HF is compressed by using a bit-width reduction scheme, the compression loss may be minimized. The specific manner in which the high spatial frequency component MCD_HF is compressed is described in more detail with reference to FIGS. 11 and 12 below.

Figure 11:
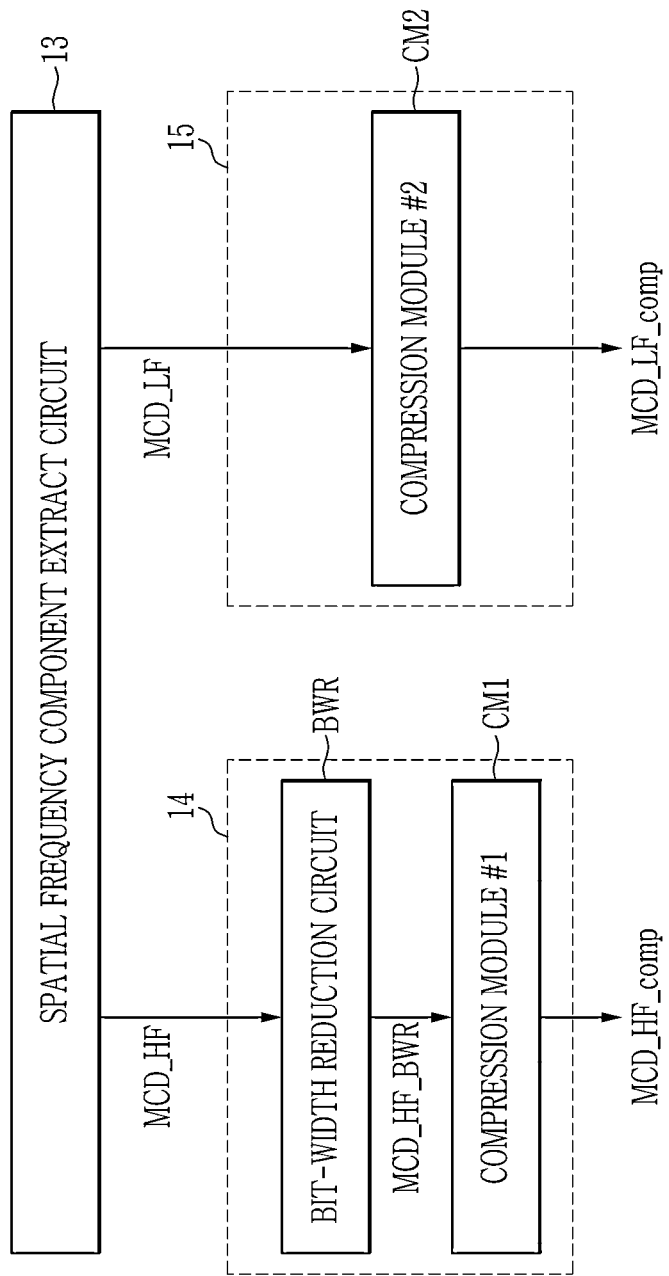
FIG. 11 illustrates a portion of the configuration of FIG. 4 implemented according to the embodiment in more detail.

FIG. 11 is a diagram illustrating a portion of the configuration of FIG. 4 implemented according to the embodiment in more detail. Referring now to FIGS. 1, and 4 to 11, the compression circuit #1 14 may include a bit-width reduction module BWR and a compression module #1 CM1. The compression circuit #2 15 may include the compression module #2 CM2.

The bit-width reduction module BWR may receive the high spatial frequency component MCD_HF from the spatial frequency component extract circuit 13. The bit-width reduction module BWR may reduce the bit-width of the compensation values included in the high spatial frequency component MCD_HF. For example, a bit-width reduction module BWR may mask the high order bits of the compensation values to generate bit-width reduced high spatial frequency component MCD_HF_BWR. In this case, a code length of the compensation values in the bit-width reduced high spatial frequency component MCD_HF_BWR will be shorter than a code length of the compensation values included in the high spatial frequency component MCD_HF. The specific operation of the bit-width reduction module BWR will be described in more detail with reference to FIG. 12 below.

In an embodiment, when the code length of the compensation values included in the high spatial frequency component MCD_HF is "8", the code length of the compensation values in the bit-width reduced high spatial frequency component MCD_HF_BWR may be "5". In this case, the capacity of the bit-width reduced high spatial frequency component MCD_HF_BWR may be about "5/8" of the capacity of the high spatial frequency component MCD_HF, and the compression ratio of the bit-width reduction module BWR may be referred to as "5/8". However, the scope of the disclosure is not limited thereto.

The compression module #1 CM1 may receive the bit-width reduced high spatial frequency component MCD_HF_BWR. The compression module #1 CM1 may compress the bit-width reduced high spatial frequency component MCD_HF_BWR based on the first compression algorithm previously described with reference to FIG. 4. That is, the compression module #1 CM1 may compress the bit-width reduced high spatial frequency component MCD_HF_BWR to generate the compressed high spatial frequency component MCD_HF_comp. In this case, the capacity of the compressed high spatial frequency component MCD_HF_comp may be less than the capacity of the bit-width reduced high spatial frequency component MCD_HF_BWR.

In an embodiment, the first compression algorithm may be multi-level compression MLC.

In an embodiment, the capacity of the compressed high spatial frequency component MCD_HF_comp may be about "1/3" of the capacity of the bit-width reduced high spatial frequency component MCD_HF_BWR. In this case, the compression ratio of the compression module #1 CM1 may be referred to as "1/3". However, the scope of the disclosure is not limited thereto.

In an embodiment, the compression ratio of the compression circuit #1 14 may be determined as a product of the compression ratio of the bit-width reduction module BWR and the compression ratio of the compression module #1 CM1. For example, the compression ratio of the compression circuit #1 14 may be determined to be "5/24," which is the product of "1/3" and "5/8". However, the scope of the disclosure is not limited thereto.

The compression module #2 CM2 may receive the low spatial frequency component MCD_LF. The compression module #2 CM2 may compress the low spatial frequency component MCD_LF based on the second compression algorithm previously described with reference to FIG. 4. That is, the compression module #2 CM2 may compress the low spatial frequency component MCD_LF to generate the compressed low spatial frequency component MCD_LF_comp.

In an embodiment, the compression ratio of the compression circuit #2 15 may be determined based on the compression ratio of the compression module #2 CM2.

In an embodiment, the compensation values in the low spatial frequency component MCD_LF may have high correlation with each other. In this case, even though the compression module #2 CM2 uses a compression algorithm with a higher compression ratio than the compression module #1 CM1, the compression loss may be minimized.

In an embodiment, the second compression algorithm used by the compression module #2 CM2 may be Principal Component Analysis (PCA). However, the scope of the disclosure is not limited thereto, and the second compression algorithm may be a dimensionality reduction technique, such as Singular Value Decomposition (SVD), Latent Semantic Analysis (LSA), and Multilevel Fuzzy (MF), or may be one of various types of compression algorithms, such as Noise Removal (NR), and 2D image down scaling. In this case, the main component of the raw mura compensation data MCD_raw and the corresponding low spatial frequency component MCD_LF may be efficiently compressed.

In an embodiment, the compression ratio of the compression module #2 CM2 may be higher than the compression ratio of the compression module #1 CM1. Further, the compression ratio of the compression circuit #2 15 may be higher than the compression ratio of the compression circuit #1 14. For example, the compression circuit #2 15 may have a compression ratio of about "1/68".

FIG. 12 is a diagram illustrating an operation of the bit-width reduction module of FIG. 11. Hereinafter, with reference to FIG. 1 and FIGS. 4 to 12, the operation of the bit-width reduction module BWR for some compensation values (for example, "CV11", "CV12", and "CV13") of the high spatial frequency component MCD_HF will be described. In addition, an embodiment in which the code length of the compensation values of the high spatial frequency component MCD_HF is "8" will be described below. However, the scope of the disclosure is not limited thereto.

First, as previously described, the high spatial frequency component MCD_HF may be determined based on the difference between the raw mura compensation data MCD_raw and the low spatial frequency component MCD_LF. Therefore, the deviation of the compensation values in the high spatial frequency component MCD_HF may be smaller compared to the deviation in the raw mura compensation data MCD_raw. In this case, the compensation values of the high spatial frequency component MCD_HF may be represented with fewer bits than the compensation values of the raw mura compensation data MCD_raw.

For example, "CV11" in the high spatial frequency component MCD_HF may be represented by the binary number "00001111", "CV12" may be represented by the binary number "00001101", and "CV13" may be represented by the binary number "00010001". In otherwords, the highest-order three bits of the high spatial frequency component MCD_HF may be equal to "000". In the following description, the highest-order three bits of the compensation values of the high spatial frequency component MCD_HF may be represent the same bit as each other.

The bit-width reduction module BWR may mask the highest-order bits of the compensation values of the high spatial frequency component MCD_HF to generate bit-width reduced high spatial frequency component MCD_HF_BWR. For example, the bit-width reduction module BWR may mask the highest-order three bits of the compensation values of the high spatial frequency component MCD_HF.

For example, when the highest-order three bits of "CV11" of the high spatial frequency component MCD_HF are masked, the binary number "01111" may become "CV11" of the bit-width reduced high spatial frequency component MCD_HF_BWR. Similarly, "CV12" in the bit-width reduced high spatial frequency component MCD_HF_BWR may be the binary number "01101", and "CV13" may be the binary number "10001". In this case, the display driving circuit 100 may be able to easily restore the high spatial frequency component MCD_HF from the bit-width reduced high spatial frequency component MCD_HF_BWR (for example, by adding back the highest-order bits).

In other words, according to an embodiment of the disclosure, even though the bit-width reduction module BWR masks the highest-order bits of the compensation values of the high spatial frequency component MCD_HF, the compensation values of the high spatial frequency component MCD_HF may be restored without loss.

In FIG. 12, the highest-order three bits of the compensation values of the high spatial frequency component MCD_HF are identical to each other. However, the scope of the disclosure is not limited to this, and the compensation values of the high spatial frequency component MCD_HF may be identical in the highest-order "N" bits. In this case, the bit-width reduction module BWR may be implemented to mask the highest-order "N" bits of the compensation values of the high spatial frequency component MCD_HF. In other words, the scope of the disclosure is not limited to the number of bits masked by the bit-width reduction module BWR.

FIG. 13 is a table showing compression ratios for the mura compensation data MCD according to the embodiment of the disclosure. The compression ratio for the raw mura compensation data MCD_raw will be described below with reference to FIG. 2, and the compression ratio when classified according to spatial frequency components will be described with reference to FIGS. 4 to 12.

First, referring to FIGS. 1, 2, and 13, the compression circuit 1c may compress the raw mura compensation data MCD_raw to generate compressed mura compensation data MCD_comp. In a more detailed example, the compression circuit 1c may compress the raw mura compensation data MCD_raw with the MLC compression algorithm. In other words, since the raw mura compensation data MCD_raw includes high spatial frequency components, the compression circuit 1c may compress the raw mura compensation data MCD_raw by using a compression algorithm with a relatively low compression ratio (for example, $1/3$) to minimize compression loss.

That is, according to the embodiment of FIG. 2, the compressed mura compensation data MCD_comp, which is about one-third the capacity of the raw mura compensation data MCD_raw, may be stored in the storage circuit 120. In this case, the capacity of mura compensation data stored in the storage circuit 120 may be about 33% of the capacity of raw mura compensation data.

On the other hand, referring to FIGS. 1, and 4 to 13, the high spatial frequency component MCD_HF may be compressed with bit-width reduction and the MLC compression algorithm.

In a more detailed example, the compression circuit #1 14 may reduce the bit-width of the high spatial frequency component MCD_HF via the bit-width reduction module BWR to generate bit-width reduced high spatial frequency component MCD_HF_BWR. In this case, the capacity of the bit-width reduced high spatial frequency component MCD_HF_BWR may be about $5/8$ of the high spatial frequency component MCD_HF.

Next, the compression circuit #1 14 may compress the bit-width reduced high spatial frequency component MCD_HF_BWR through the compression module #1 CM1 to generate the compressed high spatial frequency component MCD_HF_comp. In this case, the capacity of the compressed high spatial frequency component MCD_HF_comp may be about $1/3$ of the capacity of the bit-width reduced high spatial frequency component MCD_HF_BWR.

Therefore, the capacity of the compressed high spatial frequency component MCD_HF_comp may be about $5/24$ ($=5/8 * 1/3$) of the capacity of the high spatial frequency component MCD_HF. In this case, the capacity of the high spatial frequency component MCD_HF may be equal to the capacity of the raw mura compensation data MCD_raw, so the capacity of the compressed high spatial frequency component MCD_HF_comp may be approximately $5/24$ of the capacity of the raw mura compensation data MCD_raw.

The low spatial frequency component MCD_LF may be compressed with the PCA compression algorithm. For example, the compression circuit #2 15 may compress the low spatial frequency component MCD_LF through the compression module #2 CM2 to generate the compressed low spatial frequency component MCD_LF_comp. In this case, the capacity of the compressed low spatial frequency component MCD_LF_comp may be about $1/68$ of the low spatial frequency component MCD_LF. Thus, the capacity of the compressed low spatial frequency component MCD_LF_comp may be about $1/68$ of the capacity of the raw mura compensation data MCD_raw.

That is, according to the embodiment of the disclosure, the compressed high spatial frequency component MCD_HF_comp that has about $5/24$ of the capacity of the raw mura compensation data MCD_raw and the compressed low spatial frequency component MCD_LF_comp that has about $1/68$ of the capacity of the raw mura compensation data MCD_raw may be stored in the storage circuit 120. In this case, the capacity of mura compensation data stored in the storage circuit 120 may be about 22% of the capacity of raw mura compensation data. Thus, according to the embodiment of the disclosure, the capacity of mura compensation data stored in the storage circuit 120 for mura compensation operation may be minimized.

Figure 14:
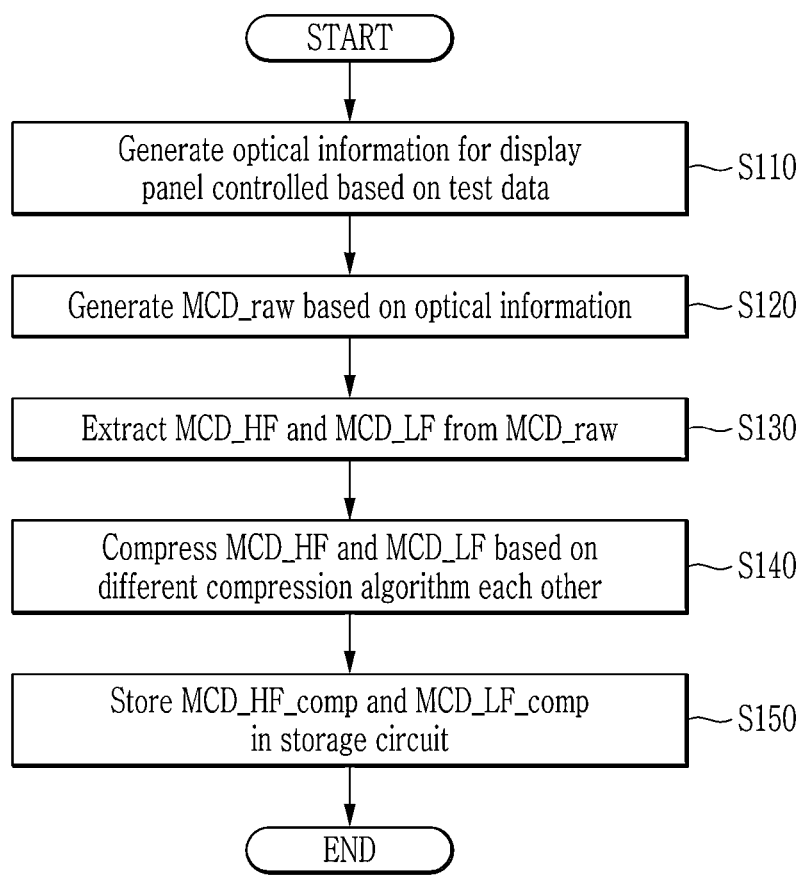
FIG. 14 illustrates operations of the mura compensation data generation device of FIG. 4.

FIG. 14 is a flow diagram illustrating an operation of the mura compensation data generation device of FIG. 4. Referring to FIGS. 1, and 4 to 14, in operation S110, the mura compensation data generation device 10 may generate optical information for the controlled display panel DP based on the test data DATA_test. For example, the optical measuring circuit 11 may generate optical information OPI representing an image output through the display panel DP.

In operation S120, the mura compensation data generation device 10 may generate the raw mura compensation data MCD_raw based on the optical information OPI. For example, the compensation data generation circuit 12 may determine a luminance level that needs to be compensated for each of the pixels of the display panel DP to generate raw mura compensation data MCD_raw. In this case, the raw mura compensation data MCD_raw may represent the luminance level determined to be compensated per pixel of the display panel DP.

In operation S130, the mura compensation data generation device 10 may extract high spatial frequency component MCD_HF and low spatial frequency component MCD_LF from the raw mura compensation data MCD_raw. For example, the spatial frequency component extract circuit 13 may extract high spatial frequency component MCD_HF and low spatial frequency component MCD_LF from the raw mura compensation data MCD_raw. The operation of operation S130 will be described in more detail below with reference to FIG. 15.

In operation S140, the mura compensation data generation device 10 may compress the high spatial frequency component MCD_HF and the low spatial frequency component MCD_LF based on different compression algorithms. For example, the compression circuit #1 14 may compress the high spatial frequency component MCD_HF by using bit-width reduction and the first compression algorithm, and the compression circuit #2 15 may compress the low spatial frequency component MCD_LF by using the second compression algorithm. The operation of the compression circuit #1 14 and the compression circuit #2 15 has been previously described with reference to FIG. 11, so a detailed description thereof will be omitted.

In an embodiment, the mura compensation data generation device 10 may compress the high spatial frequency component MCD_HF and the low spatial frequency component MCD_LF sequentially or simultaneously. In other words, the scope of the disclosure is not limited to the order of operation of the compression circuit #1 14 and the compression circuit #2 15.

In operation S150, the mura compensation data generation device 10 may store the compressed high spatial frequency component MCD_HF_comp and the compressed low spatial frequency component MCD_LF_comp in the storage circuit 120. For example, the compression circuit #1 14 may store the compressed high spatial frequency component MCD_HF_comp in the storage circuit 120, and the compression circuit #2 15 may store the compressed low spatial frequency component MCD_LF_comp in the storage circuit 120.

In an embodiment, the storage circuit 120 may be included in the display driving circuit 100. However, the scope of the disclosure is not limited to this, and the storage circuit 120 may exist outside of the display driving circuit 100.

Figure 15:
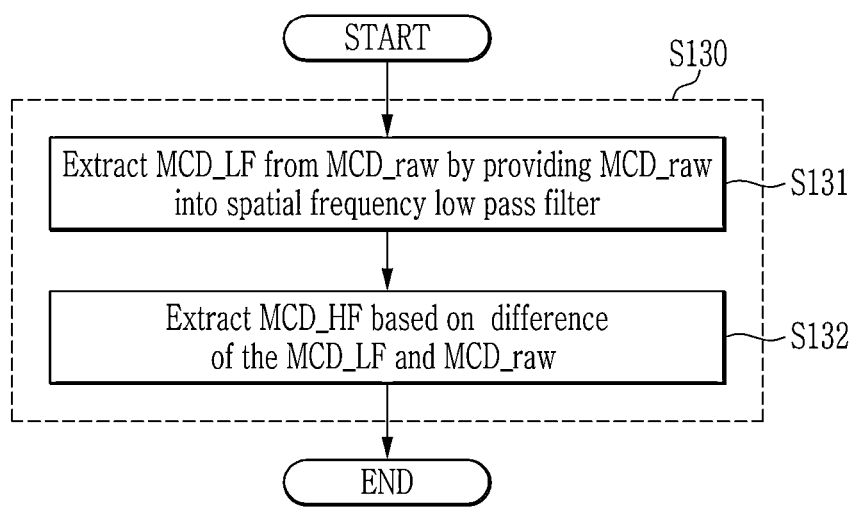
FIG. 15 illustrates operation S130 of FIG. 14 in more detail.

FIG. 15 is a flow diagram illustrating operation S130 of FIG. 14 in more detail.

Referring to FIGS. 1, and 4 to 15, the operation S130 may include operations S131 and S132 below.

In operation S131, the spatial frequency component extract circuit 13 may provide the raw mura compensation data MCD_raw to the spatial frequency low pass filter to extract low spatial frequency component MCD_LF from the raw mura compensation data MCD_raw.

In operation S132, the spatial frequency component extract circuit 13 may extract the high spatial frequency component MCD_HF based on the difference between the raw mura compensation data MCD_raw and the low spatial frequency component MCD_LF.

Figure 16:
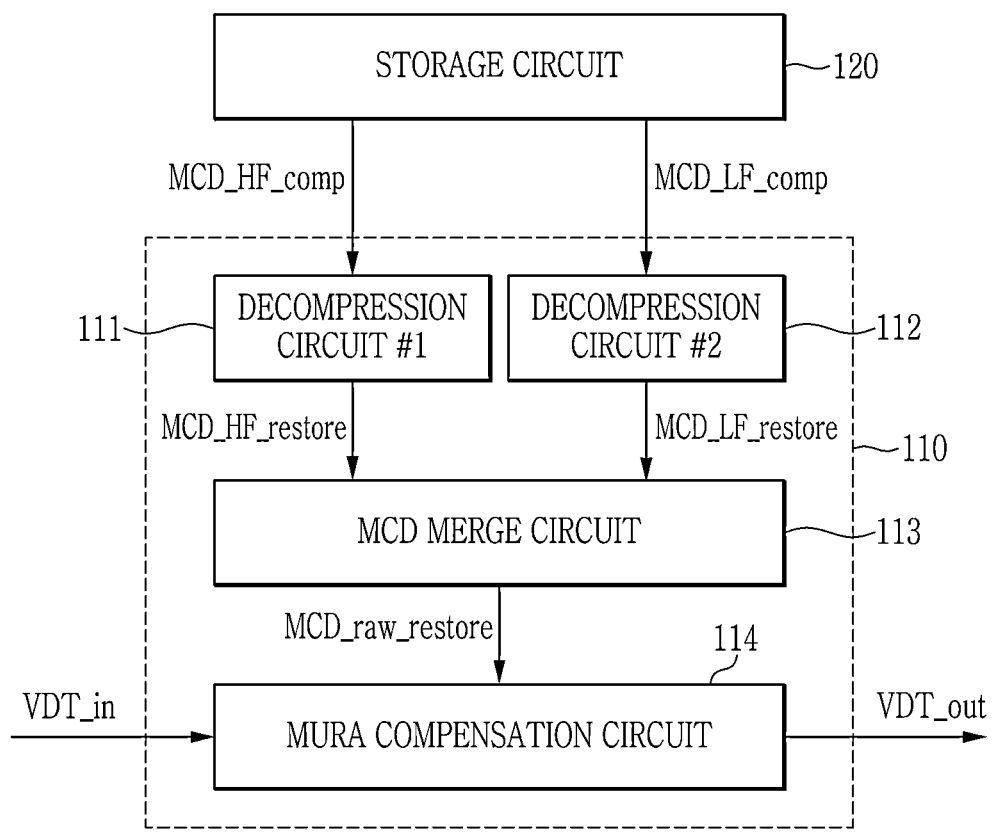
FIG. 16 illustrates operations of the display driving circuit of FIG. 1 according to the embodiment of the disclosure.

FIG. 16 is a block diagram illustrating an operation of the display driving circuit 100 of FIG. 1 according to the embodiment of the disclosure. Referring to FIGS. 1, and 4 to 16, the storage circuit 120 may store the compressed high spatial frequency component MCD_HF_comp and the compressed low spatial frequency component MCD_LF_comp.

The mura compensator 110 may receive the compressed high spatial frequency component MCD_HF_comp and the compressed low spatial frequency component MCD_LF_comp from the storage circuit 120 to perform a mura compensation operation on the input video data VDT_in. For example, the mura compensator 110 may include a decompression circuit #1 111, a decompression circuit #2 112, a mura compensation data (MCD) merge circuit 113, and a mura compensation circuit 114.

The decompression circuit #1 111 may receive the compressed high spatial frequency component MCD_HF_comp from the storage circuit 120. For example, the decompression circuit #1 111 may decompress the compressed high spatial frequency component MCD_HF_comp based on the first compression algorithm.

For example, the decompression circuit #1 111 may sequentially perform the reverse operation of the compression module #1 CM1 and the bit-width reduction module BWR previously described with reference to FIG. 11. That is, the decompression circuit #1 111 may perform the reverse operation of the compression module #1 CM1 on the compressed high spatial frequency component MCD_HF_comp to generate bit-width reduced high spatial frequency component MCD_HF_BWR. The decompression circuit #1 111 may then perform the reverse operation of the bit-width reduction module BWR on the bit-width reduced high spatial frequency component MCD_HF_BWR to generate restored high spatial frequency component MCD_HF_restore.

Similarly, the decompression circuit #2 112 may receive the compressed low spatial frequency component MCD_LF_ comp from the storage circuit 120. The decompression circuit #2 112 may decompress the compressed high spatial frequency component MCD_HF_comp based on the second compression algorithm.

For example, the decompression circuit #2 112 may perform the reverse operation of the compression module #2 CM2 previously described with reference to FIG. 11. That is, the decompression circuit #2 112 may perform the reverse operation of the compression module #2 CM2 on the compressed low spatial frequency component MCD_LF_comp to generate restored low spatial frequency component MCD_LF_restore.

The MCD merge circuit 113 may merge the restored high spatial frequency component MCD_HF_restore and the restored low spatial frequency component MCD_LF_restore to generate restored raw mura compensation data MCD_raw_restore. In this case, the restored raw mura compensation data MCD_raw_restore may correspond to the raw mura compensation data MCD_raw previously described with reference to FIG. 4.

In an embodiment, the MCD merge circuit 113 may perform a sum operation on the restored high spatial frequency component MCD_HF_restore and the restored low spatial frequency component MCD_LF_restore to generate the restored raw mura compensation data MCD_raw_restore. In this case, each of the compensation values included in the restored raw mura compensation data MCD_raw_restore may be determined by the sum of the compensation values arranged at corresponding positions of the restored high spatial frequency component MCD_HF_restore and the restored low spatial frequency component MCD_LF_restore. However, the scope of the disclosure is not limited thereto.

In an embodiment, the MCD merge circuit 113 may perform a weighted sum operation on the restored high spatial frequency component MCD_HF_restore and the restored low spatial frequency component MCD_LF_restore to generate the restored raw mura compensation data MCD_raw_restore. In this case, each of the compensation values included in the restored raw mura compensation data MCD_raw_restore may be determined by a weighted sum of the compensation values arranged at corresponding positions of the restored high spatial frequency component MCD_HF_restore and the restored low spatial frequency component MCD_LF_restore. However, the scope of the disclosure is not limited thereto.

That is, according to an embodiment of the disclosure, from the compressed high spatial frequency component MCD_HF_comp and the compressed low spatial frequency component MCD_LF_comp, the restored raw mura compensation data MCD_raw_restore which corresponds to the raw mura compensation data MCD_raw may be generated. Thus, according to the embodiment of the disclosure, the capacity of mura compensation data stored in the storage circuit 120 for mura compensation operation may be minimized.

In an embodiment, the mura compensation data (that is, the restored raw mura compensation data) generated by the MCD merge circuit 113 may also be referred to as merged mura compensation data. The merged mura compensation data may be used for the mura compensation operation for the display panel DP.

The mura compensation circuit 114 may receive the restored raw mura compensation data MCD_raw_restore from the MCD merge circuit 113. The mura compensation circuit 114 may perform the mura compensation operation on the input video data VDT_in based on the restored raw mura compensation data MCD_raw_restore. For example, the mura compensation circuit 114 may compensate the luminance information of each pixel on the display panel DP represented by the input video data VDT_in with the compensation values arranged at corresponding positions in the restored raw mura compensation data MCD_raw_restore to generate output video data VDT_out.

In a more detailed example, the luminance information of the pixel arranged in the first row and first column of the display panel DP represented by the output video data VDT_out may be determined by the luminance information of the pixels arranged in the first row and first column of the display panel DP represented by the input video data VDT_in, and the sum of the compensation value CV11 arranged in the first row and the first column of the restored raw mura compensation data MCD_raw_restore. However, the scope of the disclosure is not limited to the specific manner in which the mura compensation circuit 114 generates the output video data VDT_out. For example, the mura compensation circuit 114 may generate the output video data VDT_out through a weighted sum of compensation values arranged at corresponding positions of the input video data VDT_in and the restored raw mura compensation data MCD_raw_restore. In this case, the luminance information of the pixel arranged in the first row and the first column of the display panel DP represented by the output video data VDT_out may be determined by the luminance information of the pixel arranged in the first row and the first column of the display panel DP represented by the input video data VDT_in, and a weighed sum of the compensation value CV11 arranged in the first row and the first column of the restored raw mura compensation data MCD_raw_restore.

In an embodiment, according to the embodiment of the disclosure, even though each of the pixels of the display panel DP represents the same luminance as each other, the magnitude of the signal provided by the source driver 150 to the display panel DP through the data lines in response to the output video data VDT_out may be different.

Figure 17:
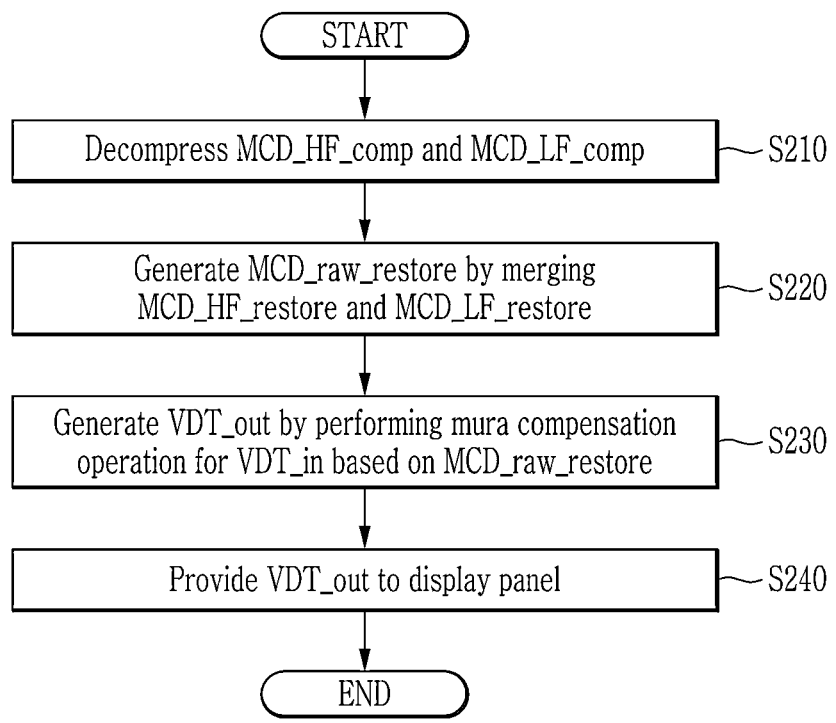
FIG. 17 illustrates operation of the display driving circuit of FIG. 16.

FIG. 17 is a flow diagram illustrating an operation of the display driving circuit 100 of FIG. 16. Referring to FIGS. 1, and 4 to 17, in operation S210, the display driving circuit 100 may decompress the compressed high spatial frequency component MCD_HF_comp and the compressed low spatial frequency component MCD_LF_comp. For example, the decompression circuit #1 111 may decompress the compressed high spatial frequency component MCD_HF_comp to generate the restored high spatial frequency component MCD_HF_restore. And, the decompression circuit #2 112 may decompress the compressed low spatial frequency component MCD_LF_comp to generate the restored low spatial frequency component MCD_LF_restore.

In an embodiment, the display driving circuit 100 may decompress the compressed high spatial frequency component MCD_HF_comp and the compressed low spatial frequency component MCD_LF_comp sequentially or simultaneously. In other words, the scope of the disclosure is not limited to the order of operation of the decompression circuit #1 111 and the decompression circuit #2 112.

In operation S220, the display driving circuit 100 may merge the restored high spatial frequency component MCD_HF_restore and the restored low spatial frequency component MCD_LF_restore to generate the restored raw mura compensation data MCD_raw_restore. For example, the MCD merge circuit 113 may perform a sum operation or a weighted sum operation on the restored high spatial frequency component MCD_HF_restore and the restored low spatial frequency component MCD_LF_restore to generate the restored raw mura compensation data MCD_raw_restore. In this case, the restored raw mura compensation data MCD_raw_restore may correspond to the raw mura compensation data MCD_raw previously described with reference to FIG. 4.

In operation S230, the display driving circuit 100 may perform a mura compensation operation on the input video data VDT_in to generate the output video data VDT_out based on the restored raw mura compensation data MCD_raw_restore. For example, the mura compensation circuit 114 may compensate the luminance information of each pixel on the display panel DP represented by the input video data VDT_in with the compensation values arranged at corresponding positions in the restored raw mura compensation data MCD_raw_restore to generate output video data VDT_out.

In operation S240, the display driving circuit 100 may provide the output video data VDT_out to the display panel DP. For example, the display driving circuit 100 may be provided to the display panel DP through the source driver 150. In this case, when the user views the Display panel DP, no mura may be observed.

Figure 18:
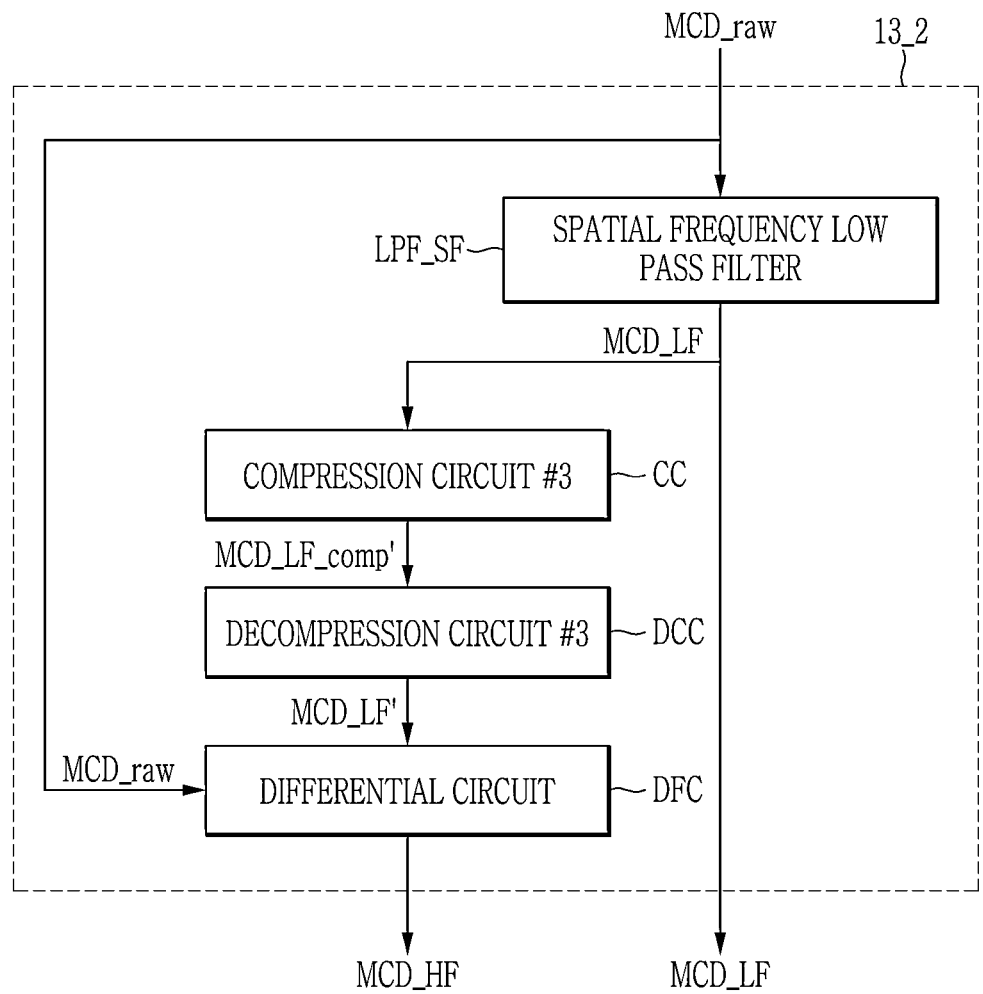
FIG. 18 illustrates the spatial frequency component extract circuit of FIG. 4 implemented accsording to the embodiment.

FIG. 18 is a block diagram illustrating the spatial frequency component extract circuit 12 of FIG. 4 implemented according to the embodiment. Referring to FIGS. 1, 4, and 18, the spatial frequency component extract circuit 13_2 may include a spatial frequency low pass filter LPF_SF, a compression circuit #3 CC, a decompression circuit #3 DCC, and a differential circuit DFC. The operation of the spatial frequency low pass filter LPF_SF is similar to that previously described with reference to FIG. 5, so a detailed description thereof is omitted.

The compression circuit #3 CC may receive and compress the low spatial frequency component MCD_LF. That is, the compression circuit #3 CC may generate the compressed low spatial frequency component MCD_LF_comp.

In an embodiment, the compression circuit #3 CC may be implemented in a manner similar to the compression circuit #2 15 previously described with reference to FIG. 4. However, the scope of the disclosure is not limited to this, and the compression circuit #3 CC and the compression circuit #2 15 may be implemented as a single component.

The decompression circuit #3 DCC may decompress the compressed low spatial frequency component MCD_LF_comp' to generate compressed and decompressed low spatial frequency component MCD_LF'. In other words, the compressed and decompressed low spatial frequency component MCD_LF' may refer to the result of compressing and decompressing the low spatial frequency component MCD_LF.

In an embodiment, the decompression circuit #3 DCC may be implemented in a manner similar to the decompression circuit #2 112 previously described with reference to FIG. 15. However, the scope of the disclosure is not limited to this, and the decompression circuit #3 DCC and the decompression circuit #2 112 may be implemented as a single component.

The differential circuit DFC may receive the raw mura compensation data MCD_raw and the compressed and decompressed low spatial frequency component MCD_LF''. The differential circuit DFC may extract the high spatial frequency component MCD_HF based on the difference between the raw mura compensation data MCD_raw and the compressed and decompressed low spatial frequency component MCD_LF''.

In an embodiment, the compressed and decompressed low spatial frequency component MCD_LF'' may reflect errors that may be caused through compression and decompression of the low spatial frequency component MCD_LF. In this case, the high spatial frequency component MCD_HF and the compressed high spatial frequency component MCD_HF_comp may reflect errors that may be caused by compression and decompression of the low spatial frequency component MCD_LF. Thus, according to the embodiment of the disclosure, the difference between the restored raw mura compensation data MCD_raw_restore and the raw mura compensation data MCD_raw may be minimized.

Figure 19:
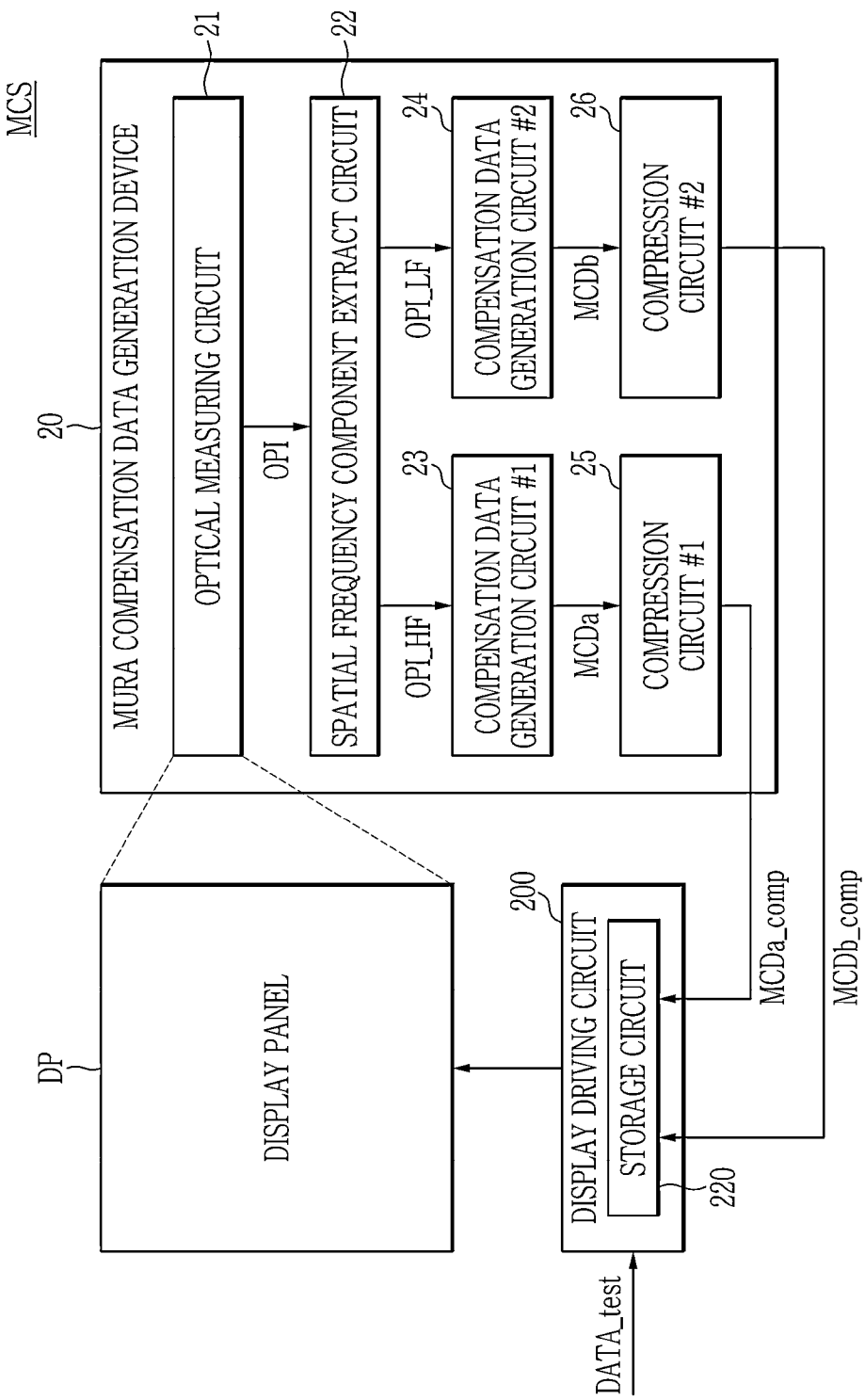
FIG. 19 illustrates a mura compensating system configured to generate the mura compensation data of FIG. 1 according to another embodiment of the disclosure.

FIG. 19 is a block diagram illustrating a mura compensating system configured to generate the mura compensation data of FIG. 1 according to another embodiment of the disclosure. Referring to FIGS. 1, 4, and 19, a mura compensation system MCS may include a display panel DP, a display driving circuit 200, and a mura compensation data generation device 20. The functions and operation of the display panel DP and the display driving circuit 200 are similar to the functions and operation of the display driving circuit 100 previously described with reference to FIGS. 1 and 4, so a detailed description thereof is omitted.

The mura compensation data generation device 20 may include an optical measuring circuit 21, a spatial frequency component extract circuit 22, a compensation data generating circuit #1 23, and a compensation data generating circuit #2 24, a compression circuit #1 25, and a compression circuit #2 26.

The optical measuring circuit 21 may generate optical information OPI representing an image output through the display panel DP. The optical information OPI may include a plurality of luminance values for each of the pixels of the display panel DP. For example, optical information OPI may include a plurality of luminance values measured per pixel of the display panel DP. More specifically, the optical information OPI may be implemented as a plurality of luminance values arranged in a row direction and a column direction. The relationship between the optical information OPI and the pixels of the display panel DP will be described in more detail below with reference to FIG. 20.

The spatial frequency component extract circuit 22 may extract a high spatial frequency component of the optical information OPI_HF and a low spatial frequency component of the optical information OPI_LF from the optical information OPI. That is, the spatial frequency component extract circuit 22 may extract a high spatial frequency component and a low spatial frequency component from the optical information OPI, unlike the embodiment previously described with reference to FIG. 4.

In an embodiment, the spatial frequency component extract circuit 22 may include a spatial frequency low pass filter. In this case, the spatial frequency component extract circuit 22 may be able to extract the low spatial frequency component of the optical information OPI_LF from the optical information OPI through the spatial frequency low pass filter. Subsequently, the spatial frequency component extract circuit 22 may extract the high spatial frequency component of the optical information OPI_HF based on the difference between the optical information OPI and the low spatial frequency component of the optical information OPI_LF. The detailed operation of the spatial frequency component extract circuit 22 is similar to that previously described with reference to FIGS. 4 to 10, so a detailed description thereof will be omitted.

In an embodiment, the capacity of the high spatial frequency component of the optical information OPI_HF and the capacity of the low spatial frequency component of the optical information OPI_LF may be same. More specifically, the number of luminance values arranged in row direction and column direction of the high spatial frequency component of the optical information OPI_HF and low spatial frequency component of the optical information OPI_LF may be equal to the optical information OPI.

The compensation data generation circuit #1 23 may generate the first mura compensation data MCDa based on the high spatial frequency component of the optical information OPI_HF. That is, the compensation data generation circuit #1 23 may determine, based on the high spatial frequency component of the optical information OPI_HF, a luminance level to be compensated for each of the pixels of the display panel DP.

The compensation data generation circuit #2 24 may generate second mura compensation data MCDb based on the low spatial frequency component of the optical information OPI_LF. That is, the compensation data generation circuit #2 24 may determine a luminance level to be compensated for each of the pixels of the display panel DP based on the low spatial frequency component of the optical information OPI_LF.

The compression circuit #1 25 may compress the first mura compensation data MCDa to generate first compressed mura compensation data MCDa_comp. For example, the compression circuit #1 25 may compress the first mura compensation data MCDa based on the first compression algorithm previously described with reference to FIG. 4.

In an embodiment, the compression circuit #1 25 may perform the compression operation in a manner similar to the compression circuit #1 14 previously described with reference to FIG. 11. For example, the compression circuit #1 25 may perform a bit-width reduction operation on the compensation values of the first mura compensation data MCDa, and then perform a compression operation with the first compression algorithm described above. In this case, the configuration and operation of the compression circuit #1 25 is similar to that previously described with reference to FIG. 11, so a detailed description thereof will be omitted.

The compression circuit #2 26 may compress the second mura compensation data MCDb to generate second compressed mura compensation data MCDb_comp. For example, the compression circuit #2 26 may compress the second mura compensation data MCDb based on the second compression algorithm previously described with reference to FIG. 4. In other words, the compression circuit #2 26 may perform the compression operation by using a compression algorithm with a higher compression ratio compared to the compression circuit #1 25. In this case, the size (capacity) of the second compressed mura compensation data MCDb_comp may be smaller than the first compressed mura compensation data MCDa_comp.

In an embodiment, the compression circuit #2 26 may perform the compression operation in a manner similar to the compression circuit #2 15 previously described with reference to FIG. 11. For example, the compression circuit #2 26 may perform the compression operation with the second compression algorithm described above on the second mura compensation data MCDb. In this case, the configuration and operation of the compression circuit #2 26 is similar to that previously described with reference to FIG. 11, so a detailed description thereof will be omitted.

The compression circuit #1 25 may store the first compressed mura compensation data MCDa_comp in the storage circuit 220. The compression circuit #2 26 may store the second compressed mura compensation data MCDb_comp in the storage circuit 220. In this way, the storage circuit 220 may store the first compressed mura compensation data MCDa_comp and the second compressed mura compensation data MCDb_comp. In this case, the sum of the capacity of the first compressed mura compensation data MCDa_comp and the second compressed mura compensation data MCDb_comp may be less than the capacity of the compressed mura compensation data MCD_comp described above with reference to FIG. 2. Thus, according to the embodiment of the disclosure, the capacity of the storage circuit 220 may be minimized.

Figure 20:
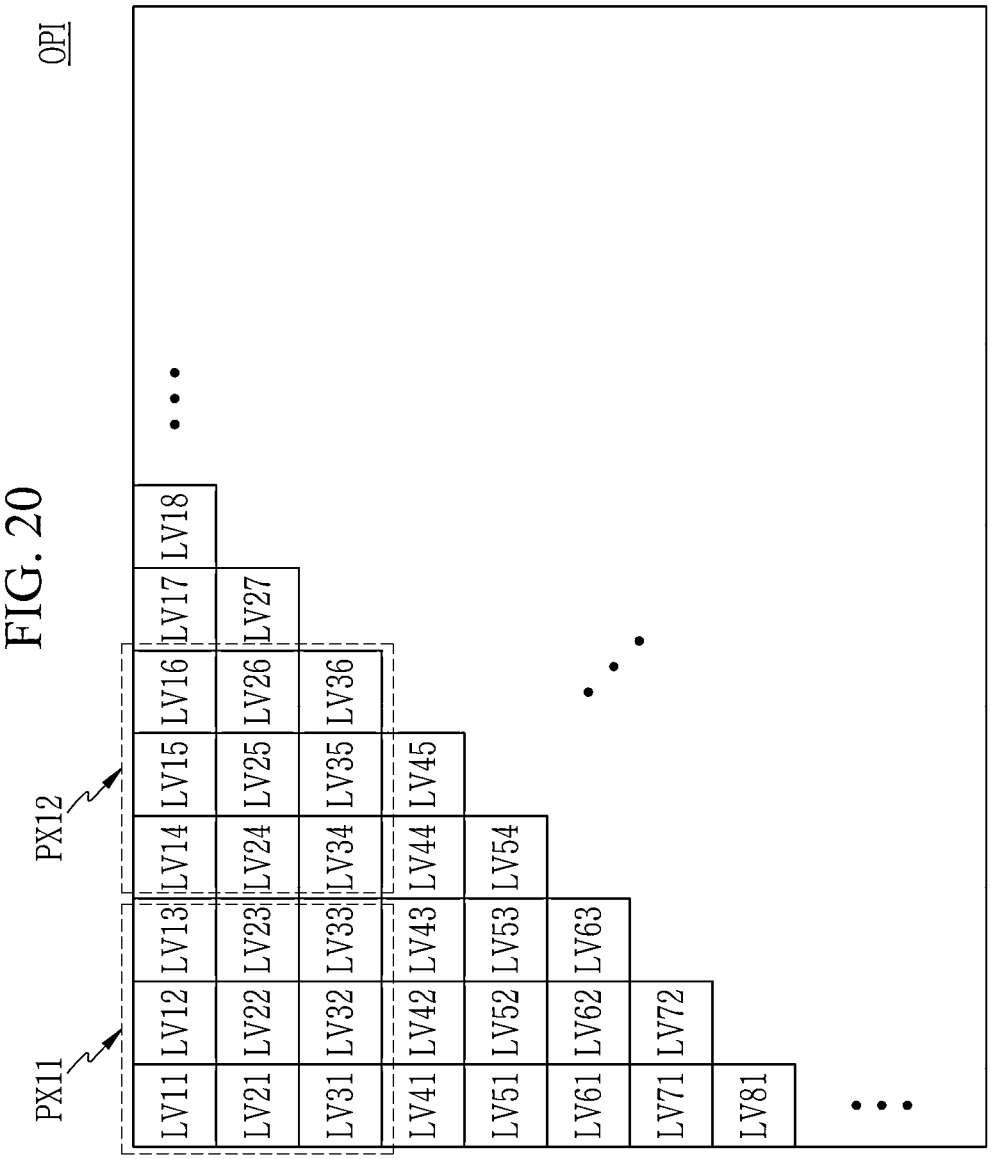
FIG. 20 illustrates optical information of FIG. 19.

FIG. 20 is a diagram illustrating the optical information OPI of FIG. 19. Referring to FIG. 1, and FIGS. 19 and 20, the optical information OPI may include a plurality of luminance values LV. In the following description, the plurality of luminance values LV may be arranged in the row direction and the column direction. Further, the luminance value arranged in the $m^{th}$ row and the $n^{th}$ column of the optical information OPI of the plurality of luminance values LV will be referred to as "LVmn". For example, the luminance value arranged in the first row and the second column of the optical information OPI may be referred to as "LV12". However, the scope of the disclosure is not limited thereto.

Each of the plurality of luminance values LV may represent a luminance value of one of the pixels of the display panel DP. An embodiment will be described below in which the optical measuring circuit 21 generates luminance values arranged 3 by 3 for each of the pixels of the display panel DP. However, the scope of the disclosure is not limited thereto. For example, the optical measuring circuit 21 may generate the arbitrary number of luminance values for each of the pixels of the display panel DP.

"LV11" to "LV13," "LV21 to "LV23," and "LV31 to "LV33" may represent luminance values for the pixel PX11 arranged in the first column of the first row of the display panel DP, and "LV14 to "LV16," "LV24 to "LV26," and "LV34 to "LV36" may represent luminance values for the pixel PX12 arranged in the second column of the first row of the display panel DP.

In an embodiment, the optical measuring circuit 21 may be implemented as an image sensor device that photographs the display panel DP. In this case, the luminance values measured for one pixel of the display panel DP may be measured through different image pixels of the image sensor device. For example, "LV11" to "LV13", "LV21" to "LV23", and "LV31" to "LV33" may be measured through nine different image pixels. However, the scope of the disclosure is not limited thereto.

The spatial frequency component extract circuit 22 may extract a high spatial frequency component and a low spatial frequency component for each row of the optical information OPI. For example, the spatial frequency component extract circuit 22 may extract a high spatial frequency component and a low spatial frequency component for the first row of the optical information OPI, based on a luminance value magnitude according to a column number of the first row of the optical information OPI. However, the scope of the disclosure is not limited thereto, and the spatial frequency component extract circuit 22 may extract a high spatial frequency component and a low spatial frequency component per column of the optical information OPI.

Hereinafter, an embodiment in which the spatial frequency component extract circuit 22 extracts a high spatial frequency component and a low spatial frequency component for the first row of the optical information OPI is described with reference to FIGS. 21A to 21C. However, the scope of the disclosure is not limited to this, and the spatial frequency component extract circuit 22 may extract a high spatial frequency component and a low spatial frequency component in a similar manner for any row or column of the optical information OPI.

Figure 21A:
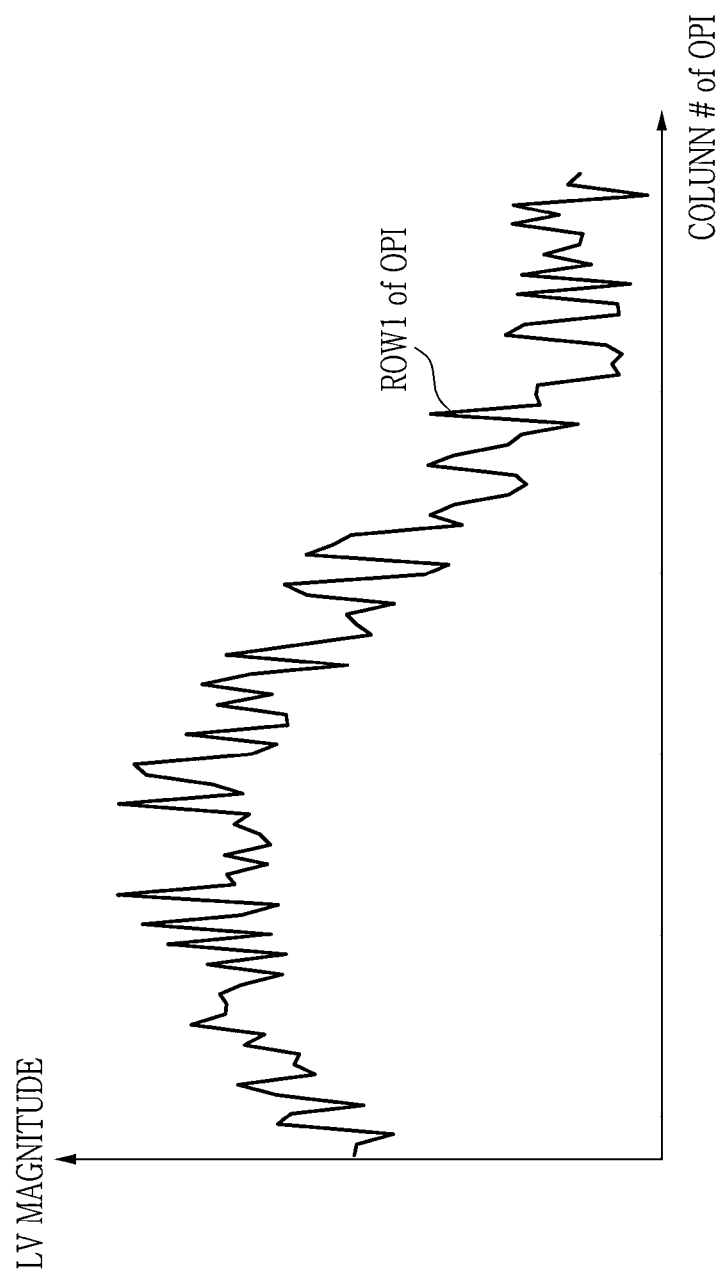
FIGS. 21A to 21C show the optical information, the low spatial frequency component of the optical information, and the high spatial frequency component of the optical information of FIG. 20, respectively.
Figure 21B:
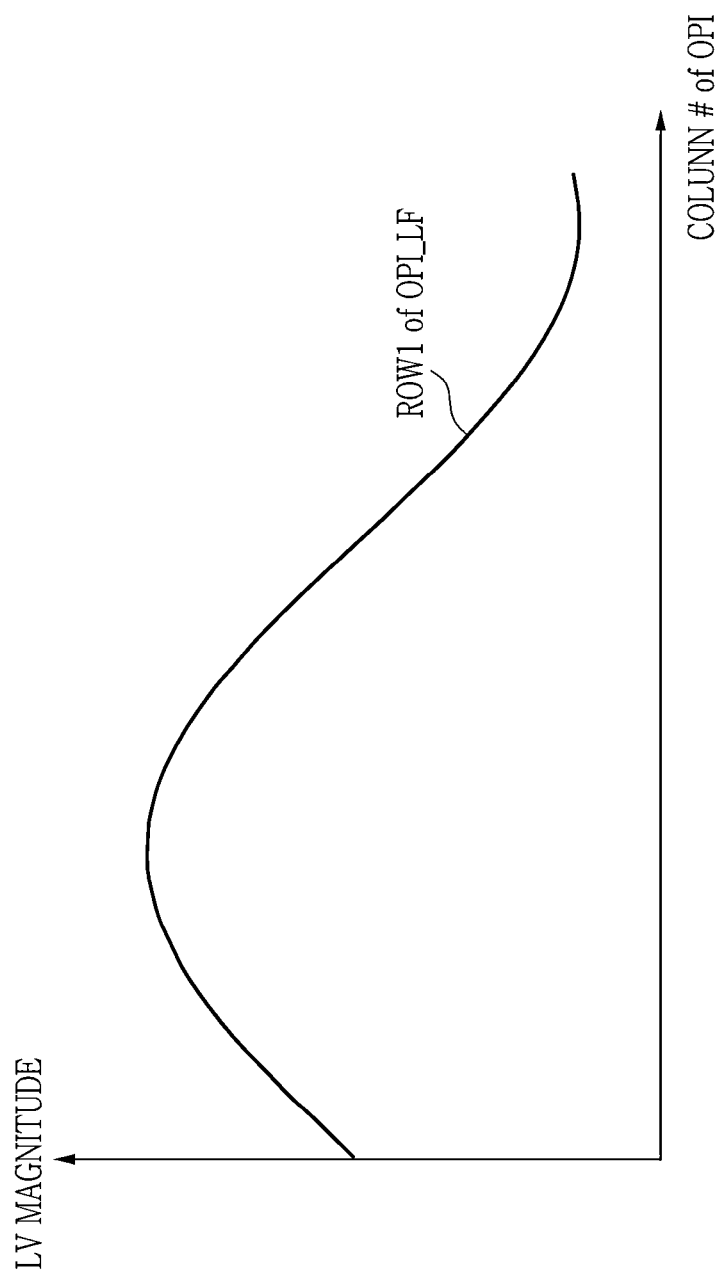
Figure 21C:
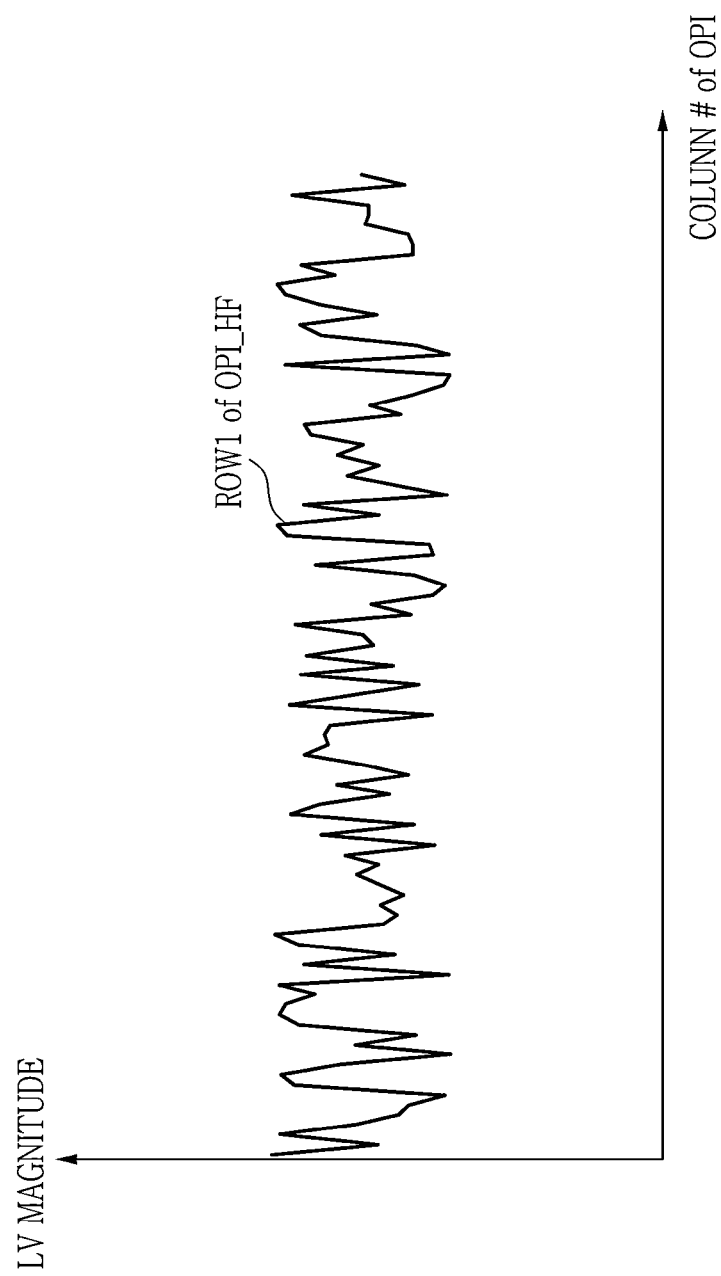

FIGS. 21A to 21C are graphs showing the optical information, low spatial frequency component of the optical information, and high spatial frequency component of the optical information of FIG. 20, respectively. In FIGS. 21A to 21C, the horizontal axis represents the column number and the vertical axis represents the magnitude of the luminance value LV.

First, FIG. 21A is a graph showing luminance values according to column numbers in the first row of the optical information OPI. Referring to FIG. 1, and FIGS. 19 to 20, and FIG. 21A, the first row of the optical information OPI may store luminance values of non-constant magnitude according to a column number.

The spatial frequency component extract circuit 22 may extract the low spatial frequency components for the first row of the optical information OPI through the spatial frequency low pass filter.

In an embodiment, the high spatial frequency component of the optical information OPI may refer to a component with a large variation in the magnitude of the luminance value based on a column number. On the other hand, the low spatial frequency component of the optical information OPI may refer to a component with a small variation in the magnitude of the luminance value based on a column number. Thus, the high spatial frequency component and the low spatial frequency component of the optical information OPI may be determined based on the magnitude of the plurality of luminance values and the arrangement of the plurality of luminance values.

FIG. 21B is a graph showing luminance values according to column numbers in the first row of low spatial frequency component of the optical information OPI_LF, extracted from the first row of the optical information OPI in FIG. 21A. Referring to FIG. 1, and FIGS. 19 to 21B, luminance values corresponding to adjacent column numbers in the first row of the low spatial frequency component of the optical information OPI_LF may have similar magnitudes to each other. This means that the luminance values of the low spatial frequency component of the optical information OPI_LF may have high correlation with each other.

FIG. 21C is a graph showing luminance values according to column numbers in the first row of the high spatial frequency component of the optical information OPI_HF, extracted from the first row of the optical information OPI in FIG. 21A. Referring to FIG. 1, and FIGS. 19 to 21C, the luminance values in the first row of the high spatial frequency component of the optical information OPI_HF may have a non-constant magnitude depending on a column number. In other words, the luminance values of the high spatial frequency component of the optical information OPI_HF may have low correlation with each other.

In an embodiment, the high spatial frequency component of the optical information OPI_HF may be extracted based on the difference between the optical information OPI and the low spatial frequency component of the optical information OPI_LF. The specific manner in which the high spatial frequency component of the optical information OPI_HF is extracted is similar to the manner in which the high spatial frequency component MCD_HF is extracted as previously described with reference to FIG. 9, so that a detailed description thereof will be omitted.

Figure 22:
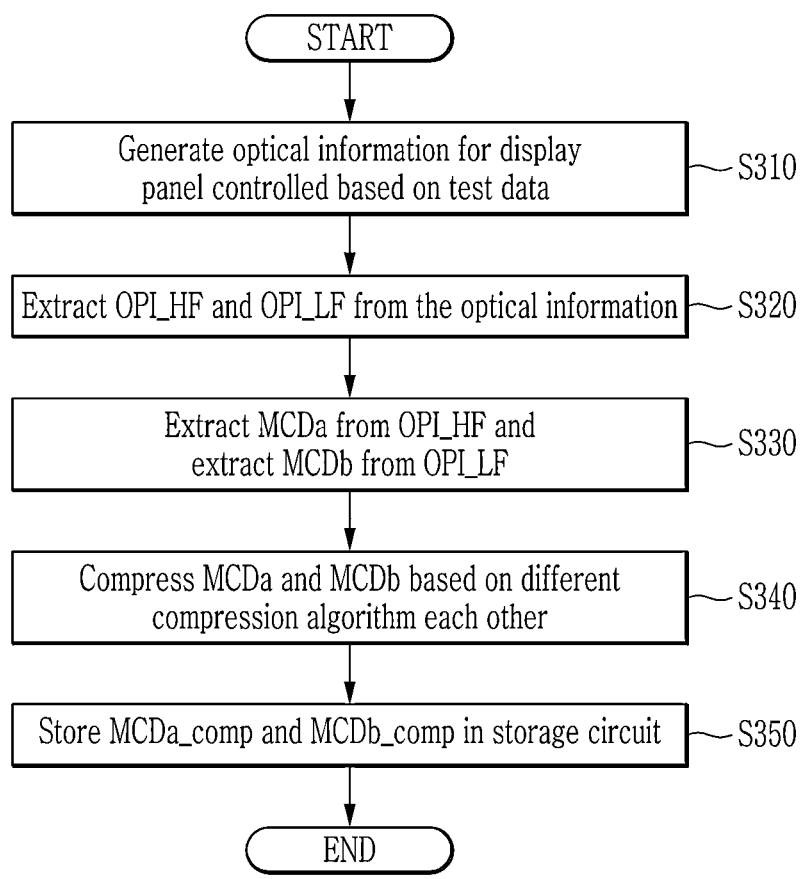
FIG. 22 illustrates operations of the mura compensation data generation device of FIG. 19.

FIG. 22 is a flow diagram illustrating the operation of the mura compensation data generation device of FIG. 19. Referring to FIG. 1 and FIGS. 19 to 22, in operation S310, the mura compensation data generation device 20 may generate optical information for the display panel DP controlled based on the test data DATA_test. For example, the optical measuring circuit 21 may generate optical information OPI representing an image output through the display panel DP.

In operation S320, the mura compensation data generation device 20 may extract high spatial frequency component of the optical information OPI_HF and low spatial frequency component of the optical information OPI_LF from the optical information OPI. For example, the spatial frequency component extract circuit 22 may extract high spatial frequency component of the optical information OPI_HF and low spatial frequency component of the optical information OPI_LF from the optical information OPI.

In operation S330, the mura compensation data generation device 20 may extract first mura compensation data MCDa from the high spatial frequency component of the optical information OPI_HF and second mura compensation data MCDb from the low spatial frequency component of the optical information OPI_LF. For example, the compensation data generation circuit #1 23 may generate the first mura compensation data MCDa based on the high spatial frequency component of the optical information OPI_HF, and the compensation data generation circuit #2 24 may generate the second mura compensation data MCDb based on the low spatial frequency component of the optical information OPI_LF.

In operation S340, the mura compensation data generation device 20 may compress the first mura compensation data MCDa and the second mura compensation data MCDb based on different compression algorithms.

For example, the compression circuit #1 25 may compress the first mura compensation data MCDa to generate the first compressed mura compensation data MCDa_comp. In this case, the compression circuit #1 25 may compress the first mura compensation data MCDa based on the first compression algorithm.

On the other hand, the compression circuit #2 26 may compress the second mura compensation data MCDb to generate the second compressed mura compensation data MCDb_comp. In this case, the compression circuit #2 26 may compress the second mura compensation data MCDb based on the second compression algorithm.

In an embodiment, the mura compensation data generation device 20 may compress the first mura compensation data MCDa and the second mura compensation data MCDb sequentially or simultaneously. In other words, the scope of the disclosure is not limited to the order of operation of the compression circuit #1 25 and the compression circuit #2 26.

In operation S350, the mura compensation data generation device 20 may store the first compressed mura compensation data MCDa_comp and the second compressed mura compensation data MCDb_comp in the storage circuit 220. For example, the compression circuit #1 25 may store the first compressed mura compensation data MCDa_comp in the storage circuit 220. The compression circuit #2 26 may store the second compressed mura compensation data MCDb_comp in the storage circuit 220.

Figure 23:
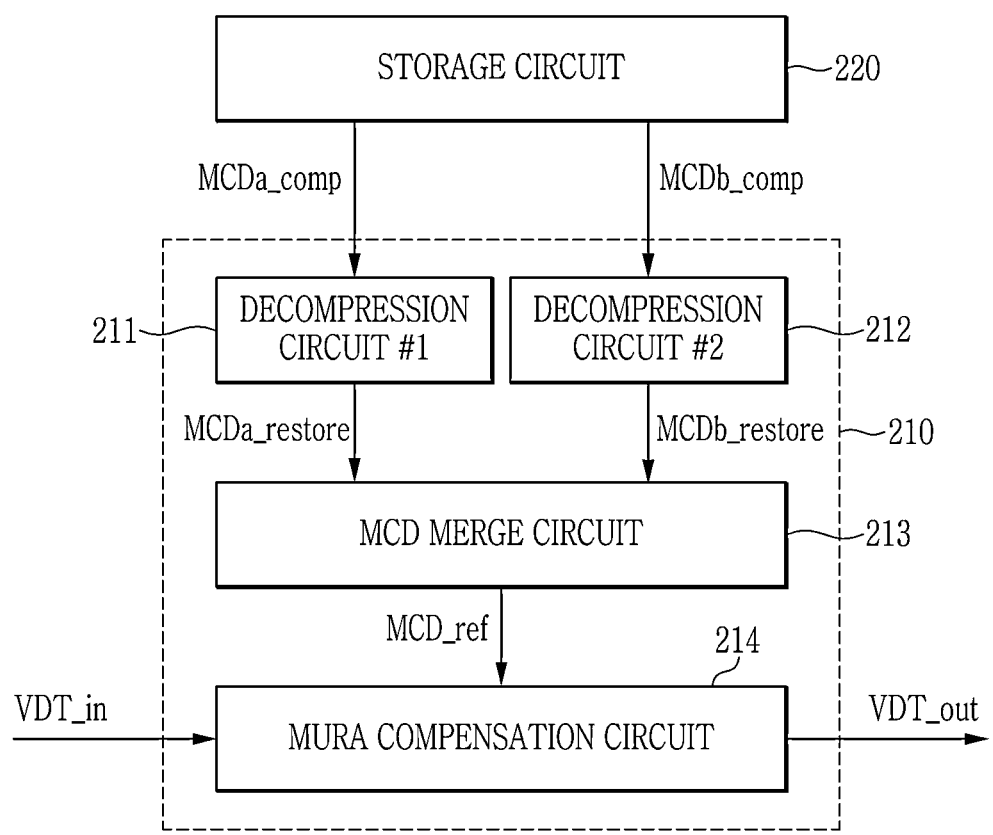
FIG. 23 illustrates operations of the display driving circuit of FIG. 1 according to another embodiment of the disclosure.

FIG. 23 is a flow diagram illustrating an operation of the display driving circuit of FIG. 1 according to another embodiment of the disclosure. Referring to FIG. 1, and FIGS. 19 to 23, the storage circuit 220 may store the first compressed mura compensation data MCDa_comp and the second compressed mura compensation data MCDb_comp.

The mura compensation circuit 210 may receive the first compressed mura compensation data MCDa_comp and the second compressed mura compensation data MCDb_comp from the storage circuit 220, and perform a mura compensation operation on the input video data VDT_in. For example, the mura compensation circuit 210 may include a decompression circuit #1 211, a decompression circuit #2 212, a mura compensation data merge circuit 213, and a mura compensation circuit 214.

The decompression circuit #1 211 may receive the first compressed mura compensation data MCDa_comp from the storage circuit 220 and decompress the received first compressed mura compensation data MCDa_comp. For example, the decompression circuit #1 211 may generate, from the first compressed mura compensation data MCDa_comp, a restored first mura compensation data MCDa_restore based on the first compression algorithm. For example, the decompression circuit #1 211 may operate in a manner similar to the decompression circuit #1 111 previously described with reference to FIG. 16.

The decompression circuit #2 212 may receive the second compressed mura compensation data MCDb_comp from the storage circuit 220 and decompress the received second compressed mura compensation data MCDb_comp. The decompression circuit #2 212 may generate, from the second compressed mura compensation data MCDb_comp, a restored second mura compensation data MCDb_restore based on the second compression algorithm. For example, the decompression circuit #2 212 may operate in a manner similar to the decompression circuit #2 112 previously described with reference to FIG. 16.

The mura compensation data merge circuit 213 may merge the restored first mura compensation data MCDa_restore and the restored second mura compensation data MCDb_restore to generate reference mura compensation data MCD_ref.

In an embodiment, the mura compensation data (that is, the reference mura compensation data) generated by the mura compensation data merge circuit 213 may also be referred to as merged mura compensation data. The merged mura compensation data may be used for the mura compensation operation for the display panel DP.

The mura compensation circuit 214 may perform a mura compensation operation on the input video data VDT_in based on the reference mura compensation data MCD_ref. For example, the mura compensation circuit 214 may compensate the luminance information of each pixel on the display panel DP represented by the input video data VDT_in with compensation values arranged at corresponding positions in the reference mura compensation data MCD_ref to generate the output video data VDT_out. The operations of the mura compensation data merge circuit 213 and the mura compensation circuit 214 are similar to those previously described with reference to FIG. 16, so a detailed description thereof will be omitted.

Figure 24:
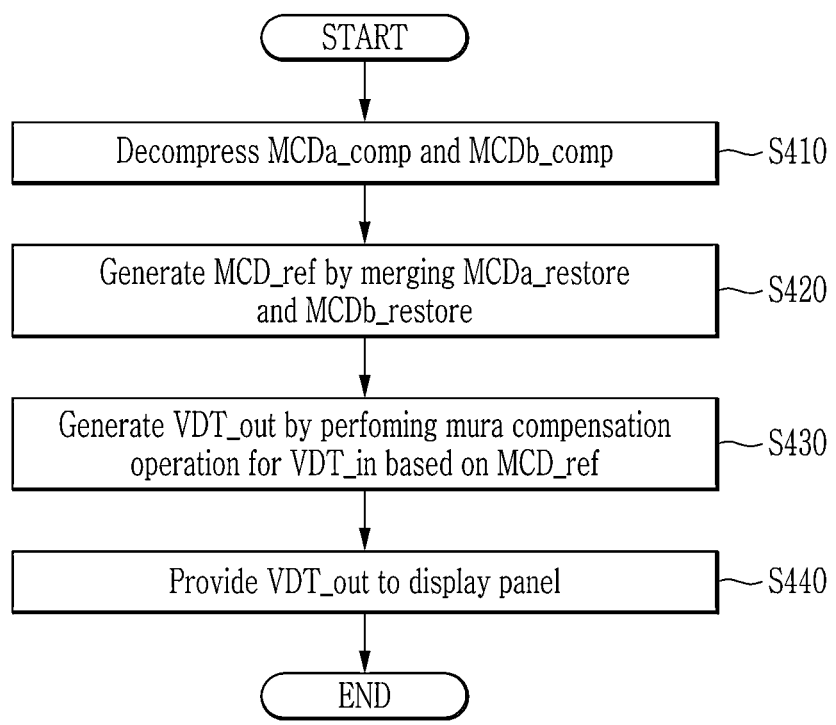
FIG. 24 illustrates operations of the display driving circuit of FIG. 23.

FIG. 24 is a flow diagram illustrating the operation of the display driving circuit of FIG. 23. Referring to FIG. 1 and FIGS. 19 to 23, in operation S410, the display driving circuit 200 may decompress the first compressed mura compensation data MCDa_comp and the second compressed mura compensation data MCDb_comp. For example, the decompression circuit #1 211 may generate restored first mura compensation data MCDa_restore from the first compressed mura compensation data MCDa_comp based on the first compression algorithm, and the decompression circuit #2 212 may generate restored second mura compensation data MCDb_restore from the second compressed mura compensation data MCDb_comp based on the second compression algorithm.

In operation S420, the display driving circuit 200 may merge the restored first mura compensation data MCDa_restore and the restored second mura compensation data MCDb_restore to generate reference mura compensation data MCD_ref. For example, the mura compensation data merge circuit 213 may merge the restored first mura compensation data MCDa_restore and the restored second mura compensation data MCDb_restore to generate reference mura compensation data MCD_ref.

In operation S430, the display driving circuit 200 may perform a mura compensation operation on the input video data VDT_in in order to generate output video data VDT_out based on the reference mura compensation data MCD_ref. In operation S440, the display driving circuit 200 may provide the output video data VDT_out to the display panel DP. Because the operation of the display driving circuit 200 in operations S430 and S440 is similar to the operation in operations S230 and S240 of FIG. 17, a detailed description thereof will be omitted.

The above are the specific embodiments for implementing the disclosure. The disclosure may include not only the embodiments described above, but also embodiments that are simply redesigned or can be easily modified. The disclosure will also include techniques that can be easily modified and practiced by using the embodiments. Accordingly, the scope of the disclosure should not be limited to the above-described embodiments, but should be defined by the following patent claims as well as those equivalents of the claims of the disclosure.

What is claimed is:

1. A method performed by a mura compensation data generation device, the method comprising:
    generating optical information for a plurality of pixels of a display panel operating based on test data;
    generating, based on the optical information, raw mura compensation data to compensate input video data provided to the display panel;
    extracting a high spatial frequency component and a low spatial frequency component from the raw mura compensation data;
    generating a compressed high spatial frequency component, by compressing, based on a first compression algorithm, the high spatial frequency component;
    generating a compressed low spatial frequency component, by compressing, based on a second compression algorithm, the low spatial frequency component; and
    storing the compressed high spatial frequency component and the compressed low spatial frequency component in an external storage circuit.

2. The method of claim 1, wherein the extracting of the high spatial frequency component and the low spatial frequency component from the raw mura compensation data, comprises:
    providing the raw mura compensation data to a spatial frequency low pass filter to extract the low spatial frequency component from the raw mura compensation data; and
    extracting the high spatial frequency component based on the raw mura compensation data and the low spatial frequency component extracted from the raw mura compensation data, via the spatial frequency low pass filter.

3. The method of claim 2, wherein the high spatial frequency component corresponds to a difference between the raw mura compensation data and the low spatial frequency component.

4. The method of claim 2, wherein the high spatial frequency component corresponds to a difference between a result of compressing and decompressing the low spatial frequency component, and the raw mura compensation data.

5. The method of claim 1, wherein the generating of the compressed high spatial frequency component, comprises:
    generating a bit-width reduced high spatial frequency component, by performing a bit-width reduction operation on at least one of a plurality of compensation values included in the high spatial frequency component; and
    generating the compressed high spatial frequency component, by compressing the bit-width reduced high spatial frequency component based on the first compression algorithm.

6. The method of claim 1, wherein a first capacity of the raw mura compensation data is equal to a second capacity of the high spatial frequency component, and
    wherein the first capacity of the raw mura compensation data is equal to a third capacity of the low spatial frequency component.

7. The method of claim 1, wherein the raw mura compensation data is a lookup table including a plurality of compensation values; and
    wherein the high spatial frequency component and the low spatial frequency component are determined based on a magnitude of the plurality of compensation values and an arrangement of the plurality of compensation values in the lookup table.

8. The method of claim 7, wherein each of the plurality of compensation values represents a luminance level to be compensated for at least one pixel of the plurality of pixels on the display panel, and
    wherein the arrangement on the lookup table of the plurality of compensation values is determined based on an arrangement on the display panel of the at least one pixel corresponding to at least one of the plurality of compensation values.

9. The method of claim 1, wherein a compression ratio of the second compression algorithm is higher than a compression ratio of the first compression algorithm.

10. The method of claim 1, wherein the display panel is configured to be controlled by a display driving circuit, and
    wherein the display driving circuit is configured to provide a signal of an equal magnitude to each column of the display panel based on the test data.

11. A display driving circuit for controlling a display panel, the display driving circuit comprising:
    a first decompression circuit configured to generate first mura compensation data by decompressing first compressed mura compensation data;
    a second decompression circuit configured to generate second mura compensation data by decompressing second compressed mura compensation data;
    a mura compensation data merge circuit configured to generate third mura compensation data by merging the first mura compensation data and the second mura compensation data; and a mura compensation circuit configured to generate output video data corresponding to input video data provided from an external device, based on the third mura compensation data, wherein a spatial frequency of the first mura compensation data is higher than a spatial frequency of the second mura compensation data.

12. The display driving circuit of claim 11, further comprising a timing controller configured to control the display panel based on the output video data.

13. The display driving circuit of claim 11, wherein the first decompression circuit and the second decompression circuit are operated based on two respectively different compression algorithms.

14. The display driving circuit of claim 13, wherein a first ratio of a capacity of the second compressed mura compensation data to a capacity of the second mura compensation data is less than a second ratio of a capacity of the first compressed mura compensation data to a capacity of the first mura compensation data.

15. The display driving circuit of claim 11, wherein a capacity of the first mura compensation data is equal to a capacity of the second mura compensation data, and wherein the capacity of the first mura compensation data is equal to a capacity of the third mura compensation data.

16. The display driving circuit of claim 11, wherein the third mura compensation data comprises a plurality of compensation values, and wherein at least one of the plurality of compensation values is used to compensate mura for at least one pixel included in the display panel.

17. A mura compensation data generation device comprising:

an optical measuring circuit configured to generate optical information including a plurality of luminance values for a plurality of pixels on a display panel operating based on test data;

a spatial frequency component extract circuit configured to extract a high spatial frequency component of the optical information and a low spatial frequency component of the optical information from the optical information, based on the plurality of luminance values;

a first compensation data generation circuit configured to generate first mura compensation data corresponding to the plurality of pixels, based on the high spatial frequency component of the optical information;

a second compensation data generation circuit configured to generate second mura compensation data corresponding to the plurality of pixels, based on the low spatial frequency component of the optical information;

a first compression circuit configured to compress, based on a first compression algorithm, the first mura compensation data and to provide the compressed first mura compensation data to an external device; and a second compression circuit configured to compress, based on a second compression algorithm, the second mura compensation data and to provide the compressed second mura compensation data to the external device.

18. The mura compensation data generation device of claim 17, wherein a compression ratio of the second compression algorithm is higher than a compression ratio of the first compression algorithm.

19. The mura compensation data generation device of claim 18, wherein a capacity of the first mura compensation data is equal to a capacity of the second mura compensation data, and wherein a capacity of the compressed first mura compensation data is larger than a capacity of the compressed second mura compensation data.

20. The mura compensation data generation device of claim 17, wherein the external device is a storage circuit included in a display driving circuit controlling the display panel.

* * * * *